(12) United States Patent
Yu et al.

(10) Patent No.: US 10,886,420 B2
(45) Date of Patent: Jan. 5, 2021

(54) THIN OPTOELECTRONIC MODULES WITH APERTURES AND THEIR MANUFACTURE

(71) Applicant: AMS SENSORS SINGAPORE PTE. LTD., Singapore (SG)

(72) Inventors: Qichuan Yu, Singapore (SG); Hartmut Rudmann, Jona (CH); Ji Wang, Singapore (SG); Kian Siang Ng, Singapore (SG); Simon Gubser, Weesen (CH); James Eilertsen, Zurich (CH); Sundar Raman Gnana Sambandam, Singapore (SG)

(73) Assignee: ams Sensors Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/091,352

(22) PCT Filed: Apr. 5, 2017

(86) PCT No.: PCT/SG2017/050194
§ 371 (c)(1),
(2) Date: Oct. 4, 2018

(87) PCT Pub. No.: WO2017/176213
PCT Pub. Date: Oct. 12, 2017

(65) Prior Publication Data
US 2019/0123213 A1 Apr. 25, 2019

Related U.S. Application Data

(60) Provisional application No. 62/319,893, filed on Apr. 8, 2016.

(51) Int. Cl.
*H01L 31/0203* (2014.01)
*H01L 31/0232* (2014.01)
(Continued)

(52) U.S. Cl.
CPC .......... *H01L 31/0203* (2013.01); *H01L 21/76* (2013.01); *H01L 27/14* (2013.01);
(Continued)

(58) Field of Classification Search
None
See application file for complete search history.

(56) References Cited

U.S. PATENT DOCUMENTS

| 4,966,862 A | 10/1990 | Edmond |
| 9,048,400 B2 * | 6/2015 | Sugiura ................. H01L 33/508 |

(Continued)

FOREIGN PATENT DOCUMENTS

| WO | WO-2009076787 A1 * | 6/2009 | ......... G02B 13/0085 |
| WO | WO-2009076788 A1 * | 6/2009 | ....... H01L 31/02164 |

(Continued)

OTHER PUBLICATIONS

ISA/SG, International Search Report for PCT/SG2017/050194 (dated Jun. 18, 2017).

*Primary Examiner* — Zandra V Smith
*Assistant Examiner* — Lawrence C Tynes, Jr.
(74) *Attorney, Agent, or Firm* — Michael Best and Friedrich LLP

(57) ABSTRACT

The wafer-level manufacturing method makes possible to manufacture ultrathin optical devices such as opto-electronic modules. A clear encapsulation is applied to an initial wafer including active optical components and a wafer-size substrate. Thereon, a photostructurable spectral filter layer is produced which defines apertures. Then, trenches are produced which extend through the clear encapsulation and establish sidewalls of intermediate products. Then, an opaque encapsulation is applied to the intermediate products, thus filling the trenches and producing aperture stops. Cutting through the opaque encapsulation material present
(Continued)

Figure 6C:
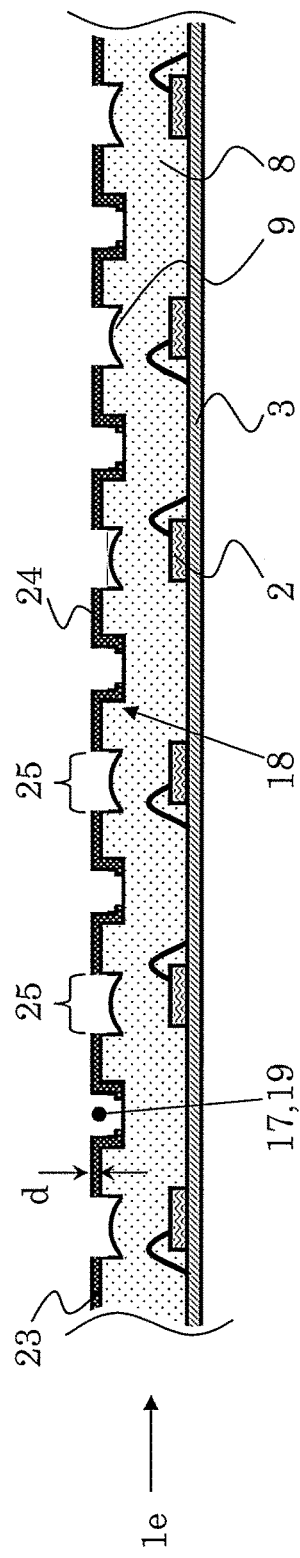

in the trenches, singulated optical modules are produced, wherein side walls of the intermediate products are covered by the opaque encapsulation material. The wafer-size substrate can be attached to a rigid carrier wafer during most process steps.

11 Claims, 13 Drawing Sheets

(51) Int. Cl.
  H01L 31/16       (2006.01)
  H01L 31/18       (2006.01)
  H01L 33/58       (2010.01)
  H01L 33/54       (2010.01)
  H01L 31/0216     (2014.01)
  H01L 21/76       (2006.01)
  H01L 27/14       (2006.01)
  H01L 33/56       (2010.01)
  H01L 33/00       (2010.01)
  H01S 5/022       (2006.01)

(52) U.S. Cl.
  CPC .. *H01L 31/02162* (2013.01); *H01L 31/02164* (2013.01); *H01L 31/02327* (2013.01); *H01L 31/16* (2013.01); *H01L 31/1876* (2013.01); *H01L 33/0095* (2013.01); *H01L 33/54* (2013.01); *H01L 33/56* (2013.01); *H01L 33/58* (2013.01); *H01L 2224/48091* (2013.01); *H01L 2224/97* (2013.01); *H01L 2924/181* (2013.01); *H01L 2924/1815* (2013.01); *H01L 2933/005* (2013.01); *H01L 2933/0058* (2013.01); *H01S 5/02228* (2013.01); *H01S 5/02288* (2013.01)

(56) References Cited

U.S. PATENT DOCUMENTS

| | | | | |
|---|---|---|---|---|
| 9,305,967 | B1* | 4/2016 | A Tharumalingam | ... G01V 8/12 |
| 2002/0057883 | A1* | 5/2002 | Malone | ............... G02B 6/4201 385/136 |
| 2004/0251509 | A1 | 12/2004 | Choi | |
| 2006/0006791 | A1* | 1/2006 | Chia | ......................... G09F 9/33 313/498 |
| 2006/0049533 | A1* | 3/2006 | Kamoshita | ....... H01L 27/14618 264/1.7 |
| 2007/0009223 | A1 | 1/2007 | Rudmann et al. | |
| 2008/0231938 | A1* | 9/2008 | Pan | .................... G02B 26/0833 359/298 |
| 2009/0206353 | A1* | 8/2009 | Okazaki | .................. H01L 33/54 257/98 |
| 2010/0264438 | A1 | 10/2010 | Suenaga | |
| 2011/0065241 | A1* | 3/2011 | Lin | ....................... H01L 33/642 438/118 |
| 2011/0084612 | A1* | 4/2011 | Ratcliffe | ................... F21V 5/10 315/112 |
| 2011/0157186 | A1* | 6/2011 | Funk | ...................... G04G 9/102 345/467 |
| 2012/0305973 | A1* | 12/2012 | Chosa | .................... H01L 33/44 257/98 |
| 2013/0019461 | A1* | 1/2013 | Rudmann | ............. G01J 5/0235 29/592.1 |
| 2013/0280890 | A1 | 10/2013 | Lei et al. | |
| 2014/0117396 | A1* | 5/2014 | Eisert | .................... H01L 33/505 257/98 |
| 2014/0361200 | A1* | 12/2014 | Rudmann | ............... H01L 25/50 250/578.1 |
| 2014/0367633 | A1* | 12/2014 | Bibl | .................. H01L 25/0753 257/13 |
| 2015/0036046 | A1* | 2/2015 | Rudmann | ............... H01L 24/94 348/374 |
| 2015/0340265 | A1* | 11/2015 | Rudmann | .......... B32B 38/1858 156/285 |
| 2016/0004154 | A1 | 1/2016 | Idei et al. | |
| 2016/0079094 | A1 | 3/2016 | Zhou et al. | |
| 2017/0161543 | A1* | 6/2017 | Smith | ................ G06K 9/00013 |

FOREIGN PATENT DOCUMENTS

WO   2016/013977   1/2016
WO   2017/061955   4/2017

* cited by examiner

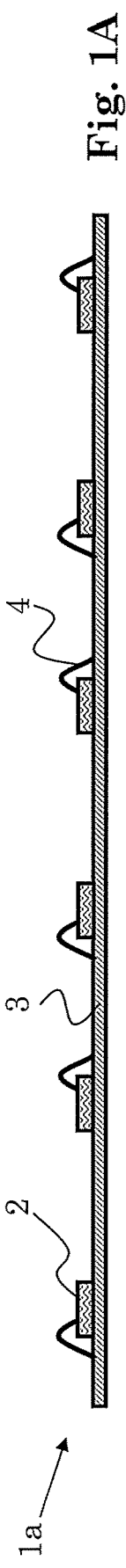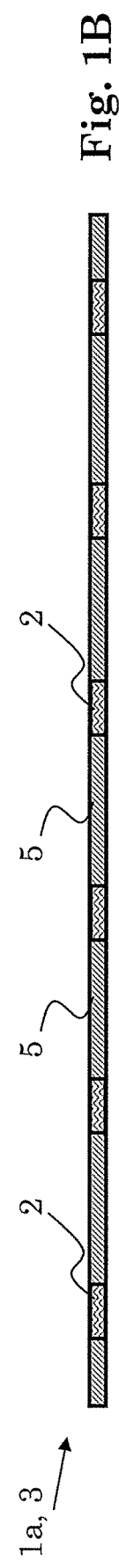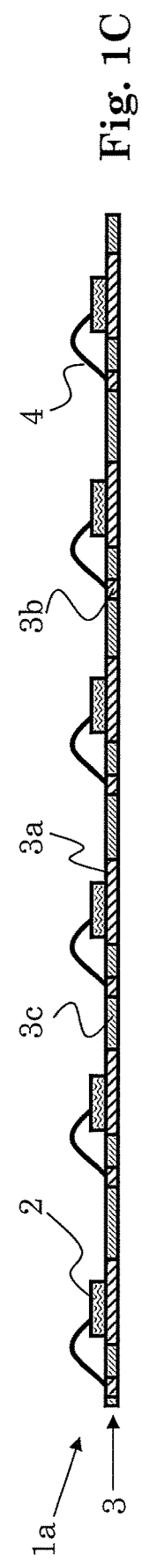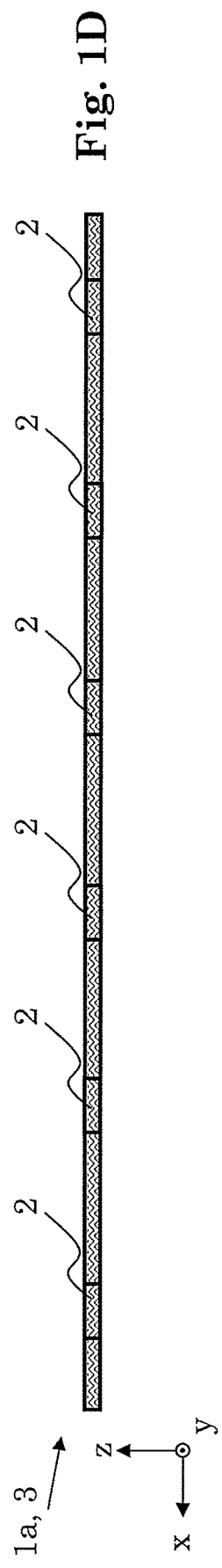

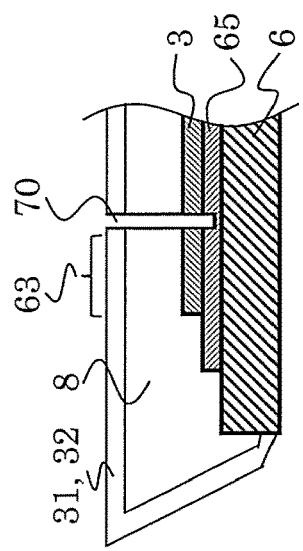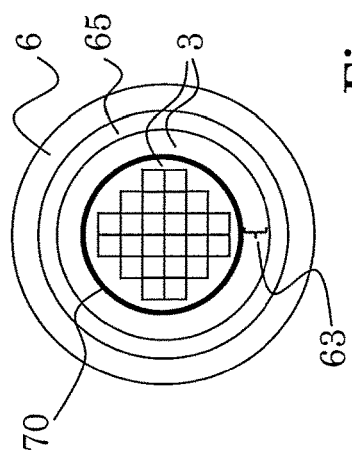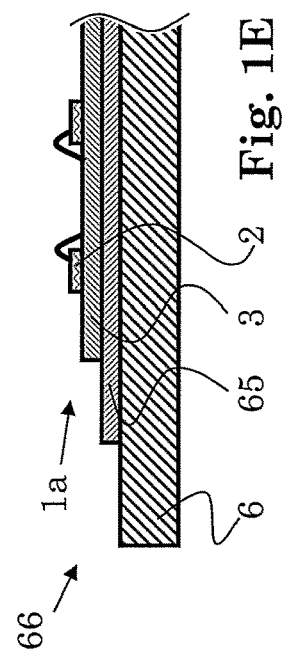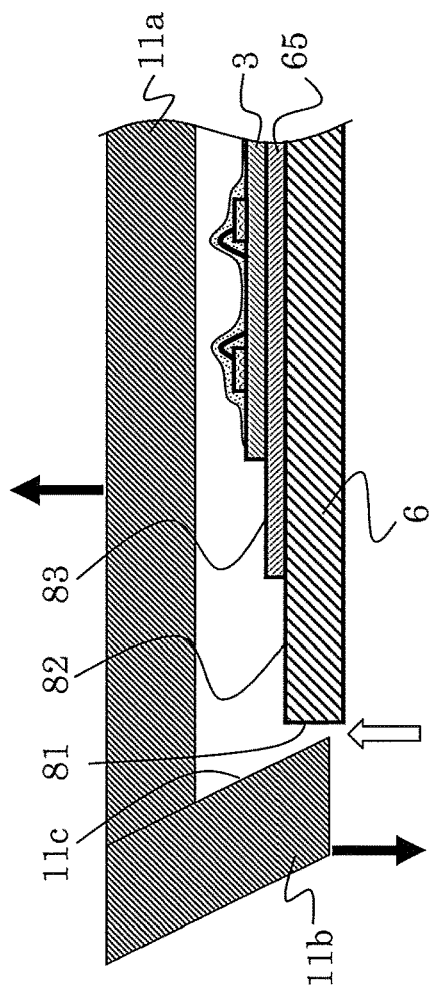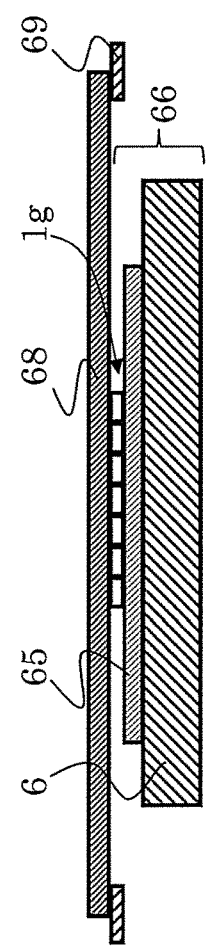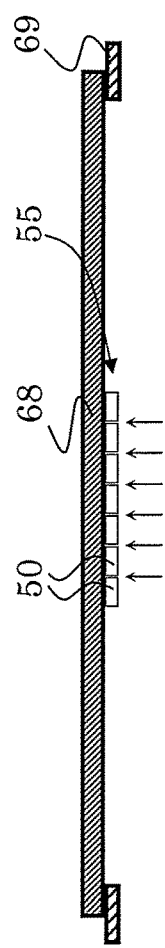

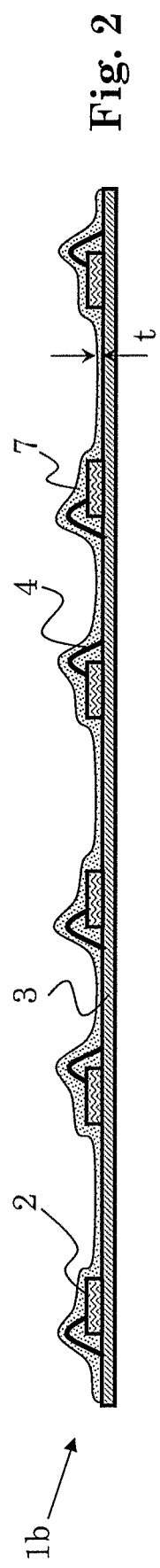
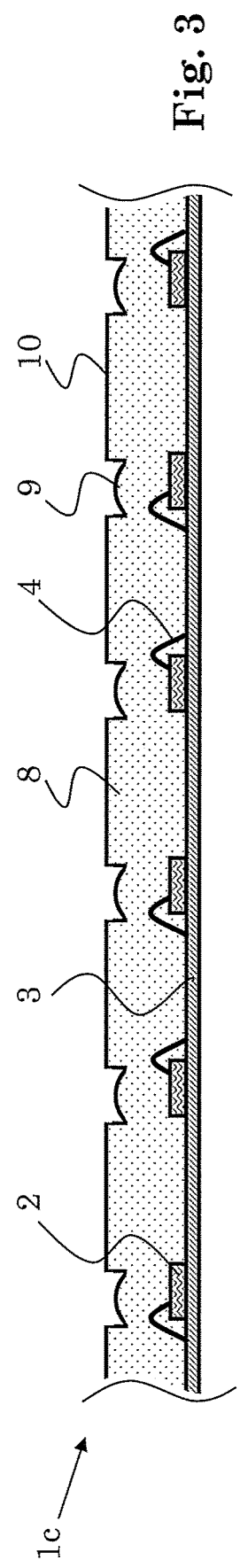
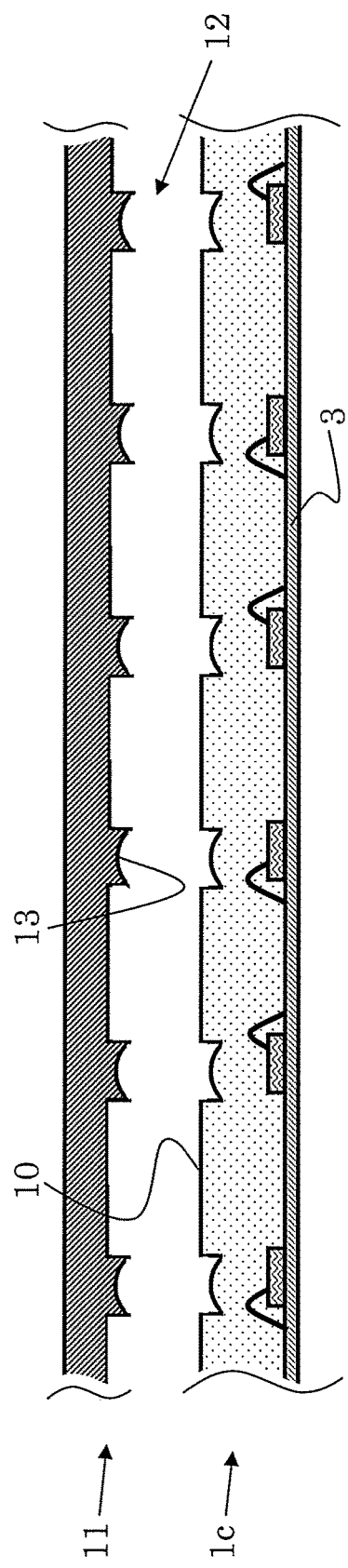

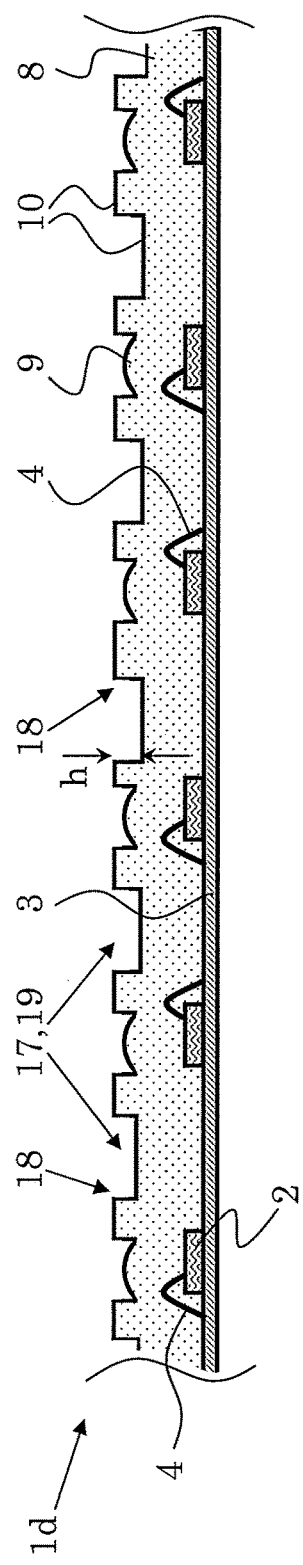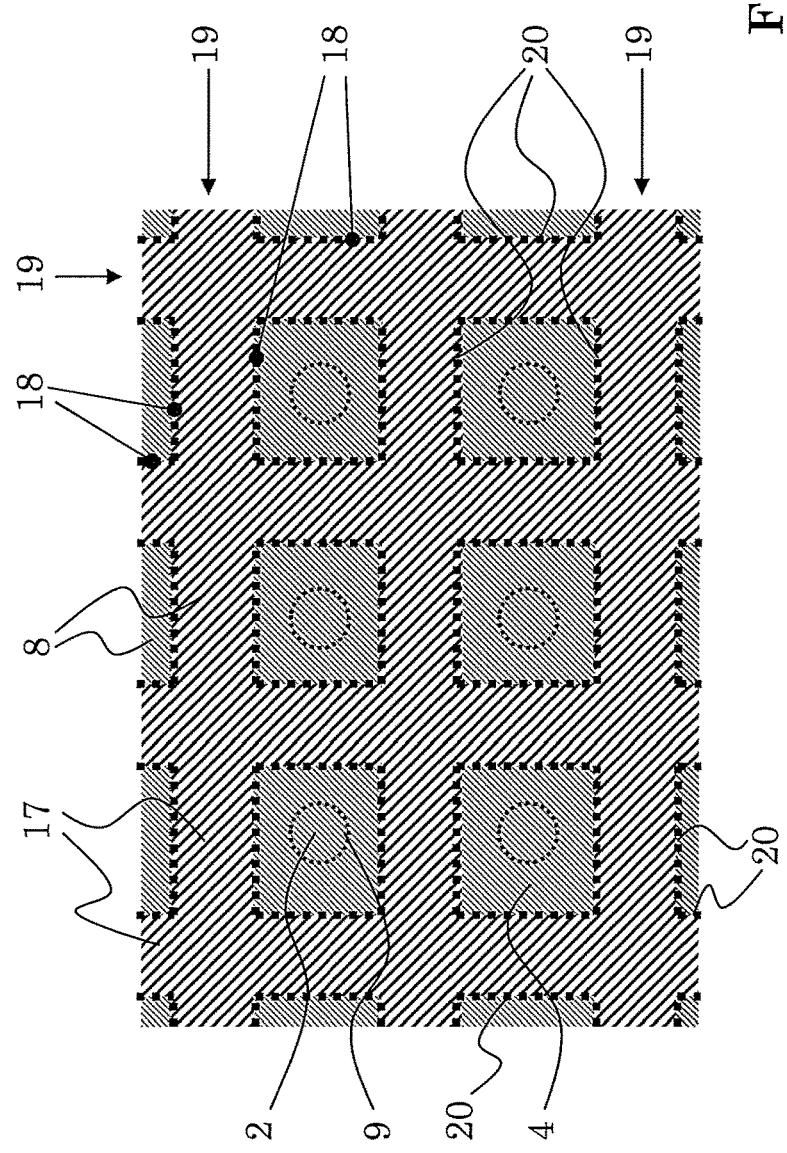

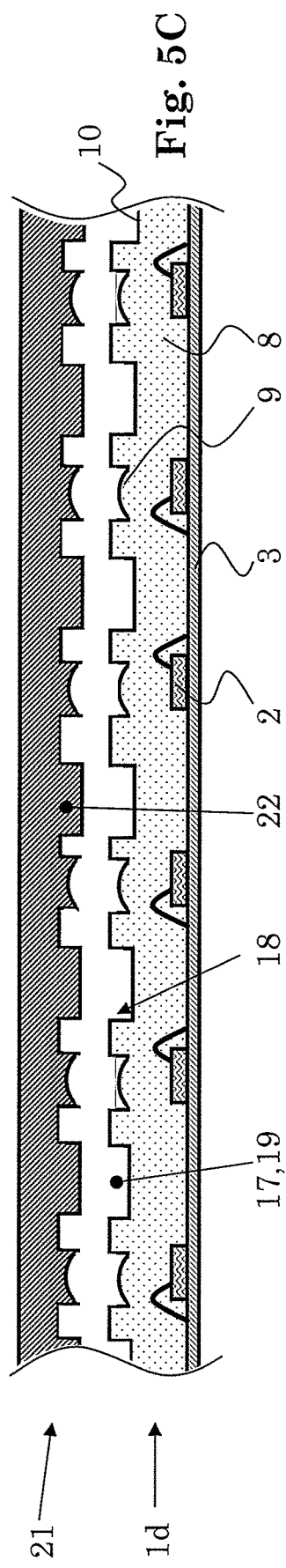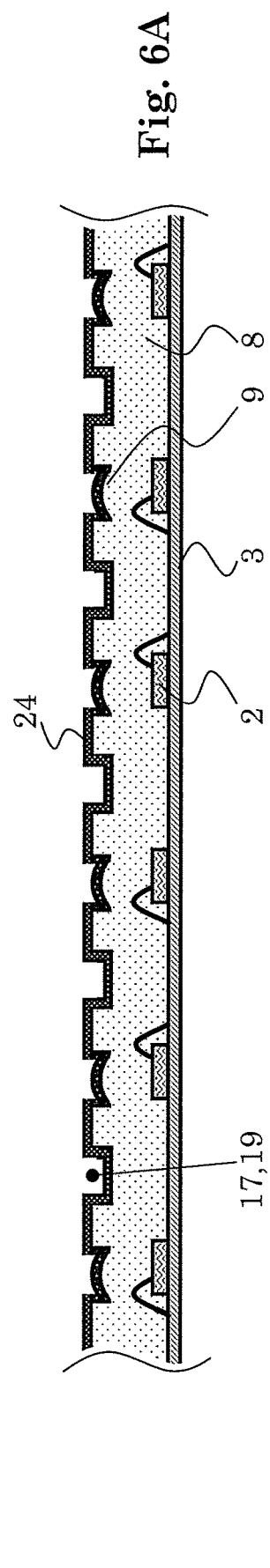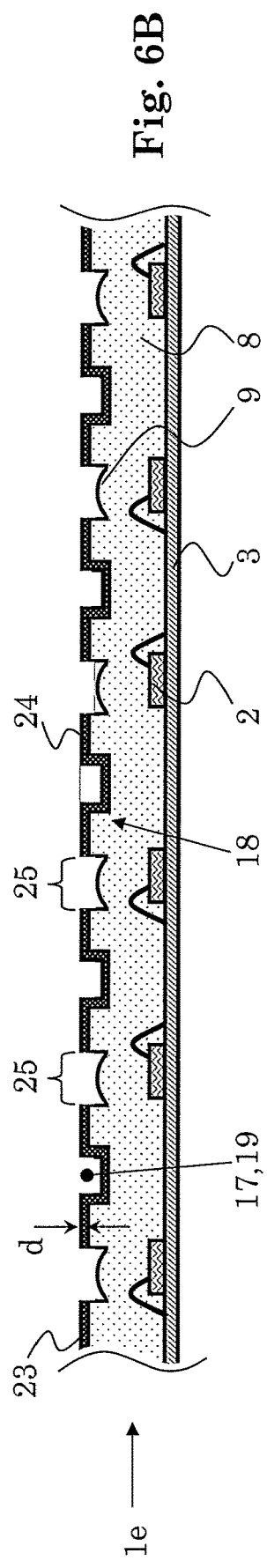

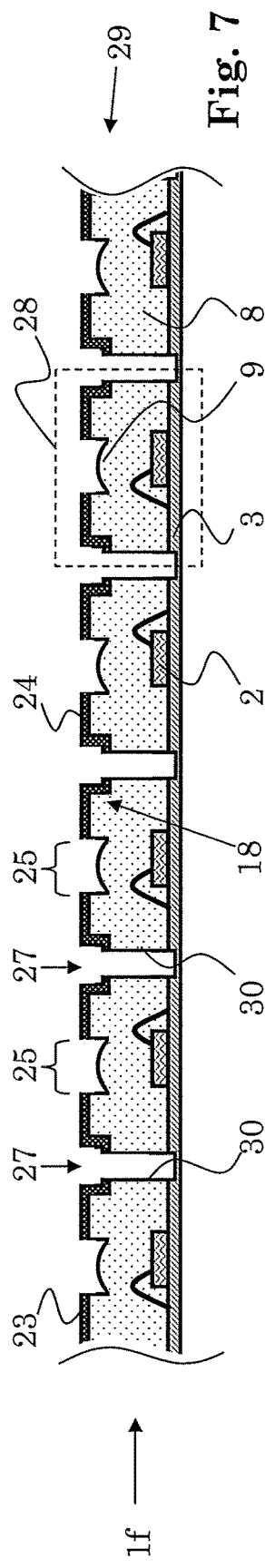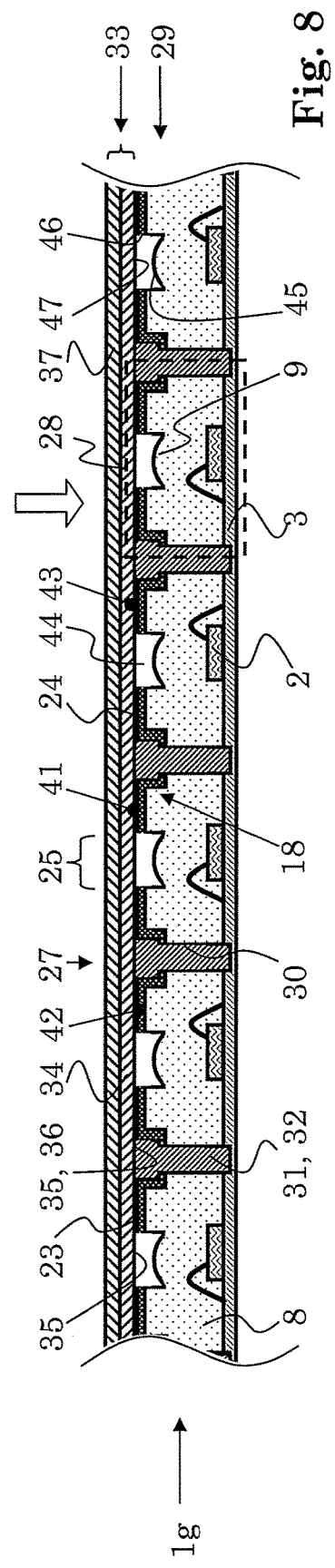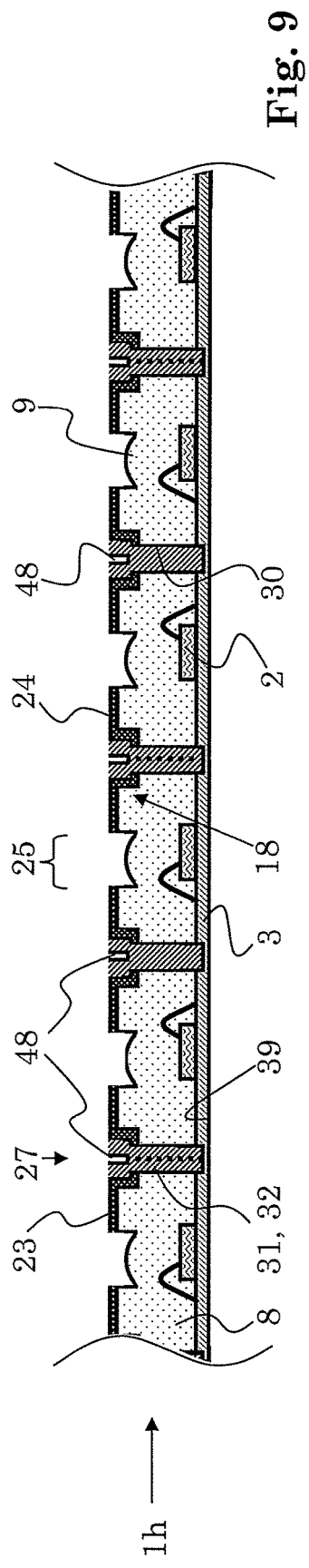

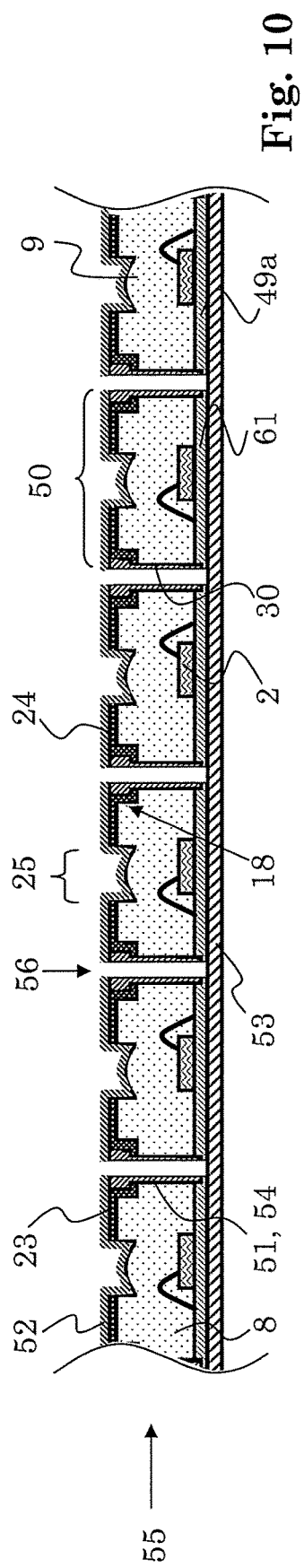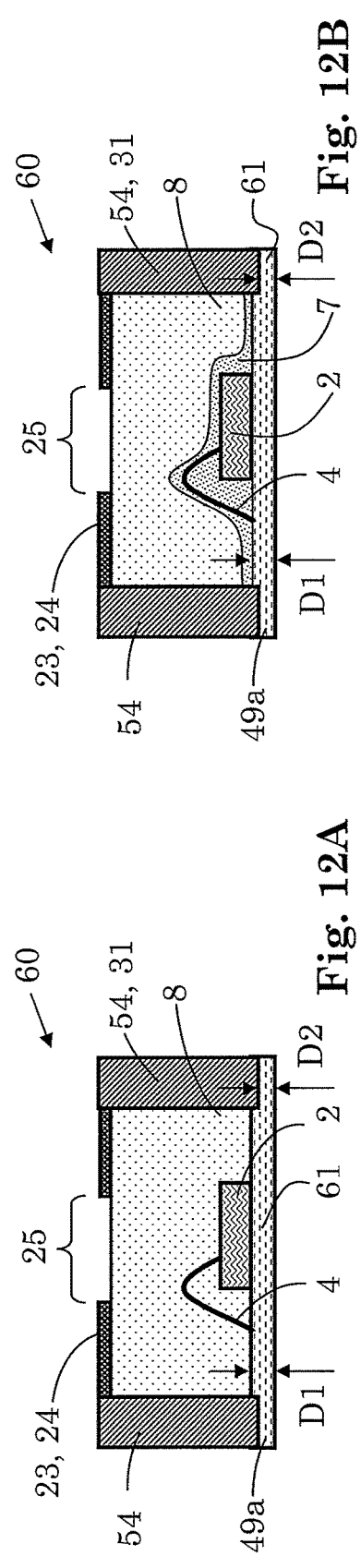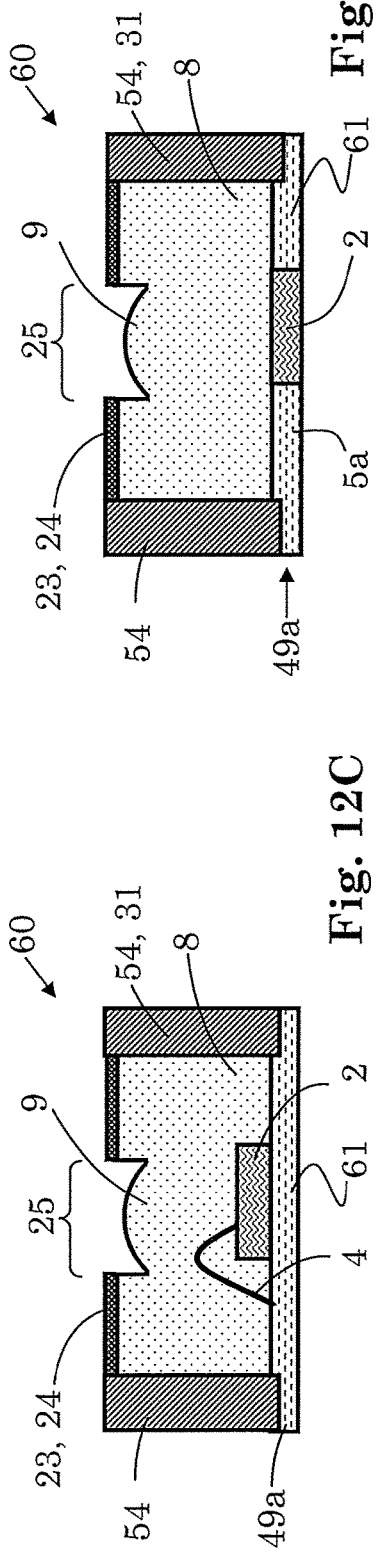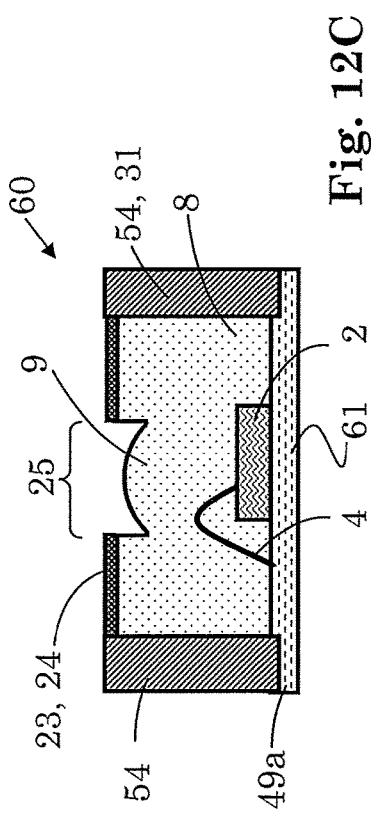

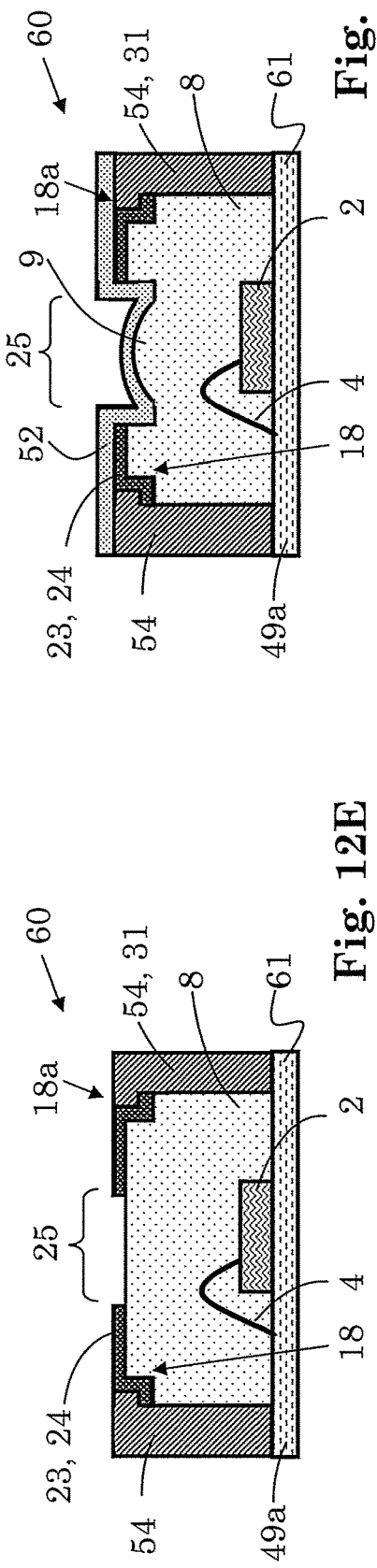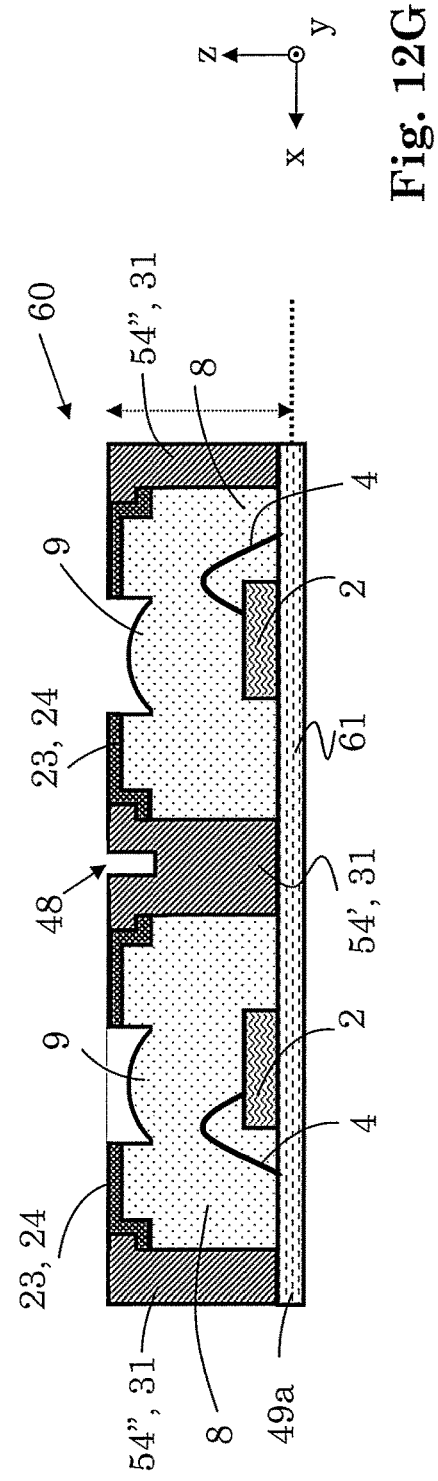

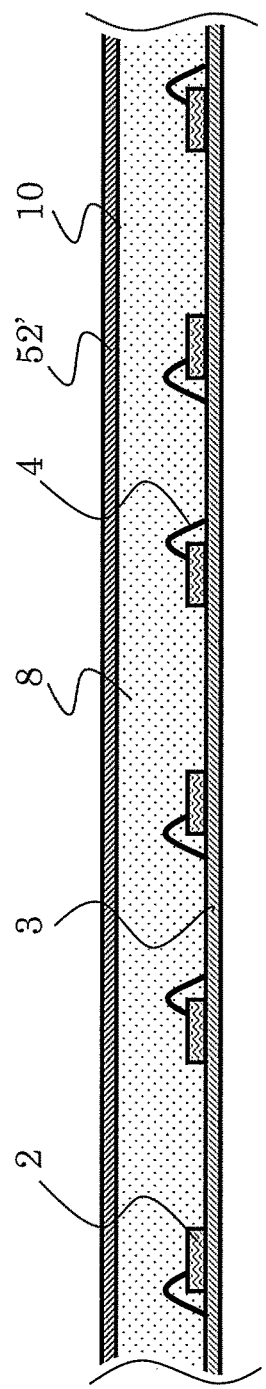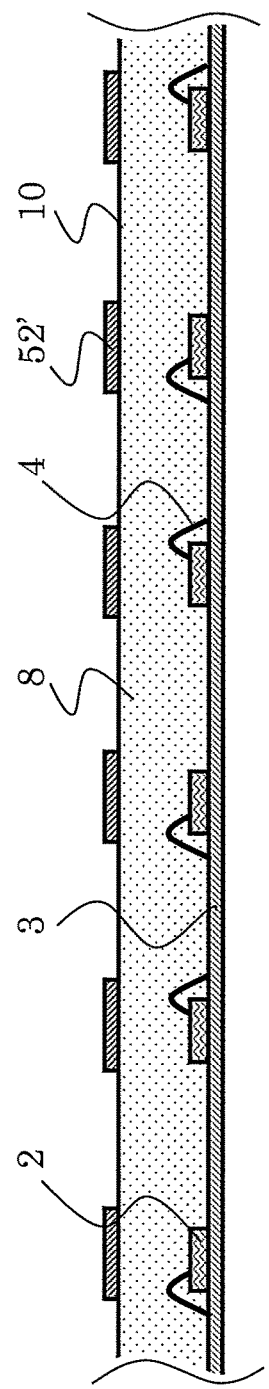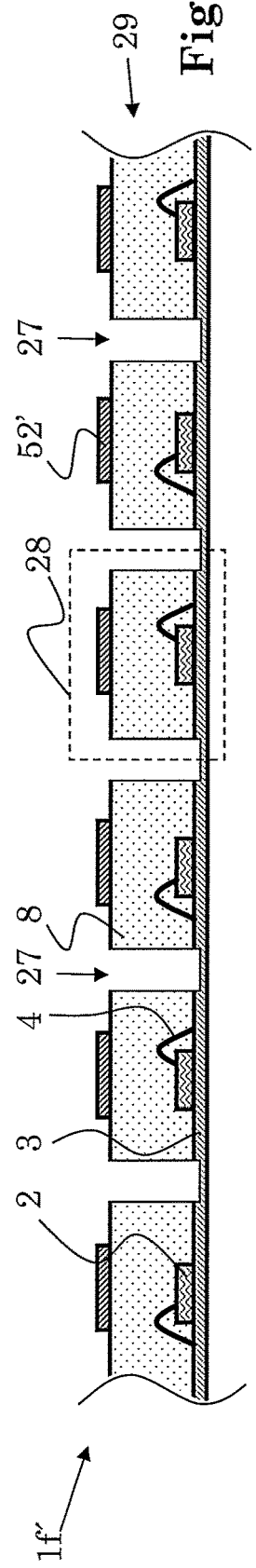

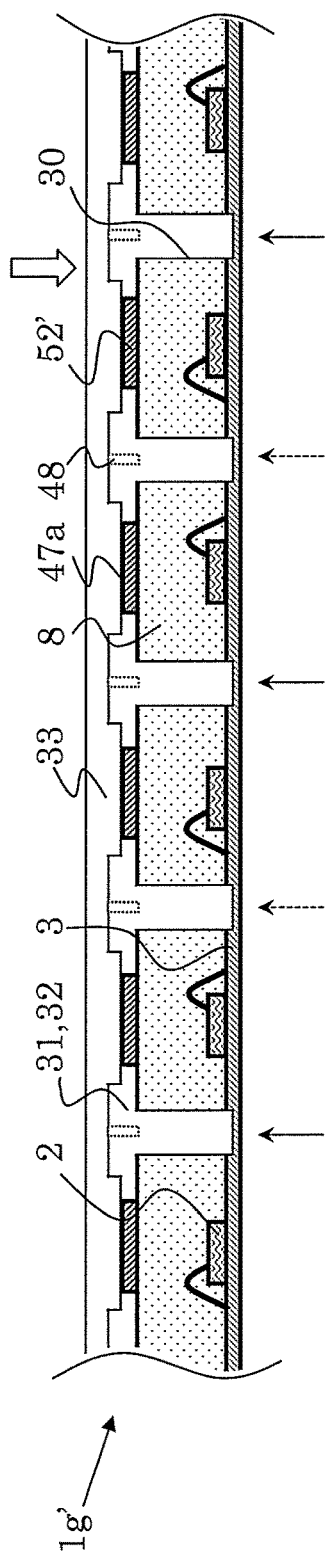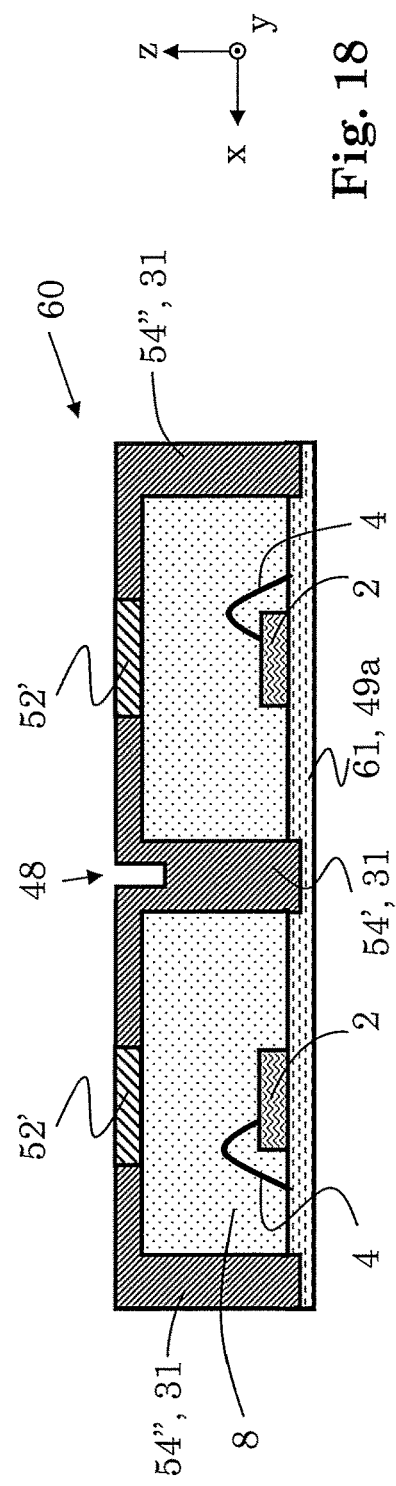

THIN OPTOELECTRONIC MODULES WITH APERTURES AND THEIR MANUFACTURE

CROSS-REFERENCE TO RELATED APPLICATION(S)

This application is the National Stage of International Application No. PCT/SG2017/050194, filed on Apr. 5, 2017, which claims the benefit of priority U.S. Application No. 62/319,893, filed on Apr. 8, 2016. The disclosure of the prior applications is incorporated herein by reference.

The present disclosure relates to ways of manufacturing optical devices such as opto-electronic modules, e.g., proximity sensors, and to corresponding devices and modules, respectively. The manufacture can be wafer-level large-scale manufacture. The optical devices can be very thin and can include precisely positioned apertures. Corresponding optical devices can be integrated in, e.g. consumer-oriented products such as smartphones, gaming systems, laptop computers, tablets, and wearable technology.

"Wafer": A substantially disk- or plate-like shaped item, its extension in one direction (z-direction or vertical direction) is small with respect to its extension in the other two directions (x- and y-directions or lateral directions or horizontal directions). Usually, on a (non-blank) wafer, a plurality of like structures or items are arranged or provided therein, e.g., on a rectangular grid. A wafer may have openings or holes, and a wafer may even be free of material in a predominant portion of its lateral area. A wafer may have any lateral shape, wherein round shapes and rectangular shapes are very common. Although in many contexts, a wafer is understood to be prevailingly made of a semiconductor material, in the present patent application, this is explicitly not a limitation. Accordingly, a wafer may prevailingly be made of, e.g., a semiconductor material, a polymer material, a composite material including metals and polymers or polymers and glass materials. In particular, hardenable materials such as thermally or UV-curable polymers may be used as wafer materials in conjunction with the presented invention.

"Horizontal": cf. "Wafer"
"Lateral": cf. "Wafer"
"Vertical": cf. "Wafer"
"Light": Most generally electromagnetic radiation; more particularly electromagnetic radiation of the infrared, visible or ultraviolet portion of the electromagnetic spectrum.

Optoelectronic modules, such as proximity sensors, are ubiquitous in myriad high-tech, especially, consumer-oriented products. Such applications demand large-scale, cost-effective manufacture of optoelectronic modules with both optimal performance and minimized dimensions. Cost efficiency can be achieved by manufacture of the optoelectronic modules via wafer-level techniques or other mass-fabrication techniques. However, these techniques often introduce a compromise between minimized dimensions (i.e., footprint and/or height) and optimal performance.

Apertures and their corresponding aperture stops (also simply referred to as stops), for example, are integral to the performance of many optoelectronic modules. Their effect on optical systems is well established. Consequently, their precise positioning can be crucial in order to achieve optimal performance.

This is accomplished, in some cases, by incorporating the aperture stops into optoelectronic modules via a separate aperture-stop wafer or baffle wafer (such as a non-transparent flat wafer with through holes). However, the height of such a separate wafer contributes to the height of the resulting optoelectronic modules.

Alternatively, aperture stops can be applied by coating surfaces of optoelectronic components on the wafer level. However, upon separating the components, the coated aperture stops can delaminate or crack.

Furthermore, heating the opto-electronic modules to rather high temperatures, e.g., for improving adhesion of an aperture-stop coating for decreasing the risk of cracks and delamination, or for curing of involved materials, can result in additional problems such as in significant warpage degrading the function of the modules.

It is known to use spacer wafers (or other intermediary components) which vertically separate different wafers such as wafers carrying passive optical components, e.g., lenses or filters from wafers carrying active optical components, e.g., light emitters and/or light detectors. Doing so results in relatively small direct contact areas between the wafers. This can be a way to reduce warpage problems, however at the expense of the spacer wafer contributing to the module thickness.

In an attempt to reduce the thickness of the modules by omitting such a spacer wafer and accepting an increased direct contact area between wafers, warpage problems tend to strongly increase. The warpage problems can be significant when materials with different coefficients of thermal expansion (CTEs) are used and/or when polymeric materials are used which tend to shrink considerably upon curing and/or solidifying.

Furthermore, if spacer wafers shall be dispensed with, another function often fulfilled by spacer wafers may have to be replaced in some way, namely to optically isolate active optical components of the opto-electronic modules, such as to avoid that light is emitted by an active optical component of the module along undesired paths and/or to avoid that light can enter the module along undesired path and be detected by an active optical component of the module; in other words, the function can be to isolate the active optical components from astray/stray light.

In addition, separate spacer wafers need to have at least some minimum wall width in order to have a required mechanical stability. This can contribute to an increased footprint of the opto-electronic modules.

The provision of separate wafers for passive optical components such as for lenses or baffles can also be considered to contribute to an increased thickness of optoelectronic modules which may be avoidable when a very low thickness of opto-electronic modules shall be achieved.

The present disclosure describes optical devices and optical device wafers which can be ultrathin, as well as their manufacture via mass-fabrication techniques. Various implementations are described that can provide one of more of: precisely positioned aperture stops; aperture stops that are not subject to delamination problems; module side walls which can be non-transparent (opaque) and can have a minimum footprint; substrates and substrate wafers which can be ultrathin; low warpage.

An example of an advantage of a version of the invention is to create optical devices, e.g., opto-electronic modules, which are very thin. On the one hand, corresponding optical devices themselves shall be provided, and on the other hand, respective methods for manufacturing the optical devices shall be provided.

Another example of an advantage of a version of the invention is to provide optical devices which have a very small footprint.

Another example of an advantage of a version of the invention is to make possible an accurate positioning of apertures.

Another example of an advantage of a version of the invention is to achieve that no or only very little delamination and/or cracking problems occur during manufacture and/or during use of the optical devices.

Another example of an advantage of a version of the invention is to achieve a good optical isolation of active optical components of the optical devices from astray/stray light.

Another example of an advantage of a version of the invention is to enable high-yield manufacture of optical devices.

Another example of an advantage of a version of the invention is to create optical devices which are—where desired—particularly light-tight.

Further objects and various advantages emerge from the description and embodiments below.

At least one of these advantages is at least partially achieved by apparatuses and methods according to the patent claims.

Several aspects are described in the present patent application, which can be taken separately but which can also be combined with each other.

First Aspect

In the method according to the first aspect, optical devices are manufactured which include at least one active optical component each. Each of the active optical components can be operable to emit or sense light of a particular range of wavelengths.

In instances, the optical device is a dual channel device, such as, e.g., a proximity sensor, including at least one light emitter and at least one light detector. Said particular range of wavelengths can be identical for these active optical components.

It is noted that a light emitter and a light detector optionally can emit and sense, respectively, also further light, i.e. also light of further wavelength ranges in addition to said light of said particular range of wavelengths.

Said particular range of wavelengths can be, e.g, in the infrared range of the electromagnetic spectrum.

An initial wafer is provided which includes the active optical components and a wafer-size substrate. As an option, the active optical components are included in the substrate. In an alternative option, the active optical components are mounted on the substrate.

In a subsequent step, a clear encapsulation is applied to the active optical components. Application of the clear encapsulation can include applying across the substrate a clear encapsulation material, e.g., a liquid polymeric material, which is translucent to light of the particular range of wavelengths.

After its application, the clear encapsulation material can be hardened, e.g., cured.

The clear encapsulation can be provided for providing mechanical protection for the active optical components. It can furthermore be a structural basis for further constituents of the optical device.

In a subsequent step, an opaque coating material is applied onto a surface of the clear encapsulation. That surface can be, e.g., aligned parallel to the substrate. That surface can be arranged opposite the substrate.

The opaque coating material can be a photostructurable material such as a photo resist. By means of photostructuring, structuring can be accomplished with very high precision, and very thin coatings can be used. This can enable production, e.g., of high-quality apertures to be produced.

Subsequently, the opaque coating material is structured, e.g., photolithographically, to produce an opaque coating on the surface of the clear encapsulation which is opaque for light of the particular range of wavelengths. During structuring, the opaque coating material can be selectively exposed to radiation such as UV radiation. In a subsequent developing process, portions of the opaque coating material (irradiated portions or not-irradiated portions) can be selectively removed from the clear encapsulation.

The opaque coating defines a multitude of apertures, wherein each aperture can be associated with one of the active optical components and can be aligned with respect to the respective associated active optical component. Referring to corresponding aperture stops, one can alternatively say that the opaque coating includes a multitude of stops, wherein each stop can be associated with one of the active optical components and aligned with respect to the respective associated active optical component.

The above does not exclude that some of the apertures and stops, respectively, are associated with two (or more) active optical components. And it neither excludes that some of the active optical components are not associated with one of the apertures and aperture stops, respectively.

In a subsequent step, a wafer-level arrangement of intermediate products is produced, wherein each intermediate product has side walls and includes a portion of the clear encapsulation, one of the active optical components and, if one of the apertures is associated with said active optical component, also the respective associated aperture. Producing the wafer-level arrangement of intermediate products includes producing trenches extending through the clear encapsulation material and establishing the side walls.

The trenches can extend through the opaque coating.

The portions of the clear encapsulation can be separate from each other, with no clear encapsulation material of the clear encapsulation interconnecting them.

The term "wafer-level arrangement" of items (such as of the intermediate products) includes that the items are held in fixed relative positions (across the wafer). This can be accomplished, e.g., by the substrate.

In a subsequent step, an opaque encapsulation is applied to the intermediate products, which includes applying to the wafer-level arrangement of intermediate products an opaque encapsulation material, e.g., a liquid polymeric material, and thereby filling the trenches (with the opaque encapsulation material). By filling the trenches, side walls, e.g., all side walls, of the intermediate products, e.g., of all intermediate products, are covered by the opaque encapsulation material.

Subsequently, the opaque encapsulation material is hardened. The opaque encapsulation material (at least after hardening) is opaque to light of the particular range of wavelengths. For accomplishing the hardening, e.g., by curing, a heat treatment, can be applied.

In a subsequent step, singulated optical modules are produced. This includes cutting through the opaque encapsulation material present in the trenches. The singulated optical modules include one of the intermediate products each, and at least one of the side walls, e.g., each of said side walls, of each respective intermediate product is covered by a respective portion of the opaque encapsulation material.

For example, the singulating can be accomplished by cutting through the opaque encapsulation material present in the trenches along singulation lines running between mutually opposing side walls of neighboring intermediate products. The singulation lines can run along and through the trenches.

The singulating can include dicing such as dicing by means of laser cutting or by means of a dicing saw.

The optical devices can include passive optical components, e.g., one per optical device and/or one per channel.

The passive optical components can include, e.g., lenses or lens elements.

Each of the passive optical components can be associated with one of the active optical components.

Each of the passive optical components can be aligned with respect to one of the apertures.

In instances, the production of the clear encapsulation includes a shaping step, e.g., during or after application of the clear encapsulation material in a liquid state and before hardening the clear encapsulation material. In said shaping step, a shape of the clear encapsulation is determined (in the sense of "is fixed").

In case the passive optical components are included in the clear encapsulation, also the passive optical components can, in instances, be shaped in said shaping step.

For example, the clear encapsulation can be applied using a replication technique. E.g., a molding process such as vacuum injection molding can be used for applying the clear encapsulation.

Accordingly, the clear encapsulation can be produced in a replication process, including producing (in the same replication process) the passive optical components.

For example, the clear encapsulation can be shaped by means of a replication tool such as a mold.

Such a replication tool can include a multitude of shaping sections, each shaping section having a shaping surface being a negative replica of a surface of one of the passive optical components.

In some embodiments, the method includes, prior to applying the clear encapsulation, applying a resilient encapsulation to the active optical components. For accomplishing this, a resilient encapsulation material which is resilient and translucent to light of the particular range of wavelengths can be applied to the active optical components.

In some embodiments, the clear encapsulation has a stepped structure including depressions and/or protrusions limited by steps. At steps, a propagation of cracks in the opaque coating can be stopped. This way, the apertures (and the corresponding stops, respectively) can be protected from damage, e.g., during producing the trenches.

In instances, producing the stepped structure includes removing a portion of the clear encapsulation material from the clear encapsulation, such as by producing grooves in the clear encapsulation material, e.g., after hardening the clear encapsulation material.

In other instances, the clear encapsulation is provided with the stepped structure during applying the clear encapsulation material. For example, the stepped structure can be produced using a structured replication tool including a negative replica of the stepped structure for shaping the clear encapsulation material in a replication process.

In instances, the replication tool is structured for producing the stepped structure and the passive optical components.

In some embodiments, each of the apertures is separated from any of the trenches by at least one region which is free of the opaque coating material. This can be the case before producing the trenches. E.g., the at least one region can be produced by the structuring of the opaque coating material.

The at least one region can protect the apertures from damage, e.g., from cracks.

Accordingly, the opaque coating can be structured to include the at least one region free of the opaque coating material, e.g., already before the trenches are produced.

For example, in one and the same structuring process, such as in one and the same photolithographic process, the apertures and said regions can be produced.

In some embodiments, the trenches along trench lines.

The trench lines can define a rectangular grid.

In some embodiments, applying the opaque encapsulation includes executing a replication process. In the replication process, a replication tool can be used for shaping the opaque encapsulation material.

The replication process can include, e.g., a vacuum injection molding process.

In some embodiments, applying the opaque encapsulation includes executing a replication process using a resilient replication tool including at least one resilient inner wall. The resilient inner wall can be made, e.g., of a silicone, such as of PDMS. The opaque encapsulation material can be shaped by the resilient inner wall. The opaque encapsulation material can be shaped by a replication surface constituted by a surface of the resilient inner wall.

Due to the resilience, the replication tool can, to some extent, adjust to possibly existing lacking flatness of the wafer.

In some embodiments, applying the opaque encapsulation includes a molding process using a mold including the resilient inner wall. The molding process can be a vacuum injection molding process.

In some embodiments, the applying of the opaque encapsulation includes
 shaping the opaque encapsulation material in a replication process using a replication tool including a surface including a replication surface for shaping the opaque encapsulation material; and
 pressing the replication surface against the opaque coating while shaping the opaque encapsulation material.

The replication tool can be, e.g., a resilient replication tool including at least one resilient inner wall such as described above.

During the pressing, a multitude of hollows can be established, and a multitude of seals can be established. Each of the seals can completely surround one of the hollows and prevent that any of the opaque encapsulation material enters the respective surrounded hollow. Each of the hollows can enclose one of the apertures. Each of the seals can be formed by a respective section of the opaque coating abutting a respective section of the surface of the replication tool.

Accordingly, contamination or damage of the apertures by the opaque encapsulation material during its application can be avoided.

The opaque encapsulation can be abutting and/or partially overlapping the opaque coating. This can contribute to light tightness of the optical device.

Application of the opaque encapsulation material can be restricted to locations which are distant from any of the apertures. This is a way of ensuring that the apertures are defined by the opaque coating only, but not by the opaque encapsulation. This can make possible the production of higher precision apertures (and corresponding stops), e.g., in case a thickness of the opaque coating is lower, e.g., lower by a factor of three or more, than a thickness of the opaque encapsulation. These thicknesses can be determined along a vertical direction, i.e. perpendicularly to the substrate.

In some embodiments, the method includes producing cuts in the opaque encapsulation material. Producing the cuts can preserve the substrate, the opaque encapsulation and the arrangement of intermediate products unsegmented. The clear encapsulation can remain uncut despite the cuts in the opaque encapsulation material. The cuts can be produced after hardening the opaque encapsulation and before producing the singulated optical modules.

The cuts can, in instances, relax mechanical stress present in the wafer.

The cuts can, in instances, reduce an aggregation of mechanical stress in the wafer arising from subsequent steps such as subsequent heat treatments.

In instances, the cuts can be produced after prior execution of a heat treatment in which the opaque encapsulation material is hardened, e.g., cured.

In instances, after producing the cuts, a heat treatment is applied to the wafer, e.g., a heat treatment for improving adherence of the opaque coating to the clear encapsulation and/or a heat treatment carried out before the singulation. This heat treatment can be carried out, e.g., after the wafer has been removed from a replication tool for shaping the opaque encapsulation material (cf. above).

In some embodiments, the hardening of the opaque encapsulation material includes application of a first heat treatment, and the cuts in the opaque encapsulation material are produced after the first heat treatment; and after producing the cuts and before the singulation, a second heat treatment is applied.

The cuts can run along cut lines. And they can extend only partially into the opaque encapsulation. And the cuts can extend not at all into the clear encapsulation.

The cuts can be produced without thereby segmenting the opaque encapsulation or any of the intermediate products into segments.

In instances, the method includes after applying the opaque encapsulation and before producing the singulated optical modules—and if the cuts are produced: before producing the cuts—the step of applying a heat treatment.

This heat treatment can be applied for strengthening an adhesion between the opaque coating and the clear encapsulation.

In some embodiments, the method includes applying a spectral filter layer onto the singulated optical modules.

The spectral filter layer can be applied after producing the singulated optical modules. The filter can let pass, e.g., IR light.

The application of the spectral filter layer can include a hardening step, such as an irradiation with light, e.g., with UV light.

In some embodiments, the spectral filter layer covers the apertures.

In some embodiments, the cuts in the opaque encapsulation material are at least partially filled by material of the spectral filter layer. In alternative embodiments, however, the cuts in the opaque encapsulation material are free from material of the spectral filter layer.

Mechanical stress due to application of the spectral filter layer, e.g., stress from shrinkage during curing, and its detrimental effects such as crack formation and delamination can be reduced when singulation takes place prior to application of the spectral filter layer.

In some embodiments, the method includes, after the producing of the singulated optical modules, an application of a heat treatment. In such a heat treatment, the singulated optical modules can be thermally stabilized. The heat treatment can be carried out, if provided, after application of the spectral filter layer (cf. above).

In another variant ("other variant") of the invention, a spectral filter layer is applied in a way different from the way described above. In this "other variant", the spectral filter layer is produced on a surface of the clear encapsulation (and thus much earlier in the process). In fact, in this "other variant", the described opaque coating can be dispensed with. And moreover, some functions fulfilled by the opaque coating can be fulfilled by the spectral filter layer. E.g., the apertures can be defined by the spectral filter layer together with the opaque coating.

This can be accomplished by having the spectral filter layer material occupy the (lateral) areas where the apertures shall be located, and by applying the opaque encapsulation material, aperture stops mating the spectral filter material (and thus, mating the apertures) are produced.

By ensuring that the (lateral) areas occupied by the spectral filter layer material (and thus the (lateral) areas where the apertures shall be located) remain uncovered by the opaque encapsulation, high precision apertures can be produced. E.g., the spectral filter material can be photostructurable, such that shape and position of the apertures are determined by a photostructuring technique. Precision requirements for the application of the opaque encapsulation can then be relatively relaxed. The opaque encapsulation can be applied, e.g., by means of a replication technique, such as by molding.

An optical device according to the "other variant" can include one or more apertures, wherein each of the apertures is delimited by the opaque encapsulation material (thus forming the corresponding aperture stop) and each of the apertures is filled by the spectral filter layer material.

In the "other variant", the method according to the first aspect can be described as a method for manufacturing optical devices including an active optical component each, the active optical components being optical components for emitting or sensing light of a particular range of wavelengths, wherein the method includes:

providing an initial wafer including the active optical components and a wafer-size substrate;

applying a clear encapsulation to the active optical components including applying across the substrate a clear encapsulation material which is translucent to light of the particular range of wavelengths;

applying onto a surface of the clear encapsulation a spectral filter layer material;

producing a spectral filter layer on the surface of the clear encapsulation, wherein the producing the spectral filter layer includes structuring the spectral filter layer material;

producing a wafer-level arrangement of intermediate products, each intermediate product having side walls and including a portion of the clear encapsulation and one of the active optical components, the producing the wafer-level arrangement of intermediate products including producing trenches, wherein the trenches extend through the clear encapsulation material and establish the side walls;

applying an opaque encapsulation to the intermediate products, including applying to the wafer-level arrangement of intermediate products an opaque encapsulation material, thereby filling the trenches, and hardening the opaque encapsulation material, the opaque encapsulation material being opaque to light of the particular range of wavelengths;

producing singulated optical modules, including cutting through the opaque encapsulation material present in the trenches, the singulated optical modules including one of the intermediate products each, at least one side wall of each respective intermediate product being covered by a respective portion of the opaque encapsulation material.

The spectral filter layer can be translucent for light of the particular range of wavelengths and be opaque for light of another range of wavelengths. For example, each of the optical devices can include a light emitter (i.e. an optical component for emitting light) and a light detector (i.e. an optical component for sensing light), and the light wavelengths emittable from the light emitter being detectable by the light detector, but the light detector being sensitive to light of further wavelengths not emittable from the light emitter. In this case, the spectral filter layer can be, e.g., translucent for light of said wavelengths emittable from the light emitter and opaque for light of said further wavelengths.

The spectral filter layer can let pass, e.g., IR light.

Applying the spectral filter layer material can be accomplished by, e.g., a spray coating process or a spinning process. For example, in case the clear encapsulation includes passive optical components, the spectral filter layer material can be applied in a spray coating process. In another example, the clear encapsulation includes no passive optical components and/or the surface of the clear encapsulation is planar, and the spectral filter layer material can be applied onto the surface in a spin coating process.

Producing the spectral filter layer can include a hardening step, such as an irradiation with light, e.g., with UV light.

Optical devices that can be manufactured by one of the described manufacturing methods can include the described singulated optical modules. They can, e.g., be identical therewith.

In the following, we disclose optical devices by describing their respective possible structural features. Of course, the optical devices can inherit features possibly not explicitly mentioned below, but arising from and/or described in conjunction with the manufacturing methods.

The optical device can include
a substrate member;
one or more active optical components operable to emit or sense light of a particular range of wavelengths;
a clear encapsulation material translucent to light of the particular range of wavelengths;
an opaque coating material opaque for light of the particular range of wavelengths, defining at least one aperture associated with the one or more active optical components;
an opaque wall structure made of an opaque encapsulation material opaque to light of the particular range of wavelengths.

The one or more active optical components can be attached to the substrate member.

The clear encapsulation material can establish an overmold for the one or more active optical components.

The clear encapsulation material can establish an overmold for at least a portion of the substrate member.

The one or more active optical components can be encapsulated by the clear encapsulation material.

The opaque coating material can be a material which is different from the opaque encapsulation material.

The opaque coating material can be photostructurable.

The substrate member can be plate-shaped.

The substrate member can have a first and a second member surfaces which are mutually parallel and opposing.

Most of the clear encapsulation material can be surrounded by the opaque encapsulation material.

The opaque coating material can be present on and interfacing the clear encapsulation material.

The opaque coating material can be present on a surface of the clear encapsulation material, wherein said surface can be opposing another surface of the clear encapsulation material facing the substrate member.

The wall structure can include one or more vertically aligned walls.

The opaque wall structure can interface the substrate member, the clear encapsulation material and the opaque coating material.

In some embodiments, the optical device includes one or more passive optical components made of the clear encapsulation material.

In some embodiments, a thickness of the substrate member in a first region in which the opaque wall structure abuts the substrate member is smaller than a thickness of the substrate member in a second region encircled by the first region. E.g., the one or more active optical components can, in the second region, be attached to the substrate member.

In some embodiments, the optical device includes a resilient encapsulation material establishing an overmold for the one or more active optical components, wherein the clear encapsulation material establishes an overmold for the resilient encapsulation material. In such embodiments, the clear encapsulation material can still establish an overmold for the one or more active optical components. It can, at the same time, establish an overmold for the resilient encapsulation material.

In some embodiments, the clear encapsulation has a stepped structure including one or more steps. The opaque coating can extend across the one or more steps. The opaque coating can have a stepped structure, too.

In some embodiments, the opaque wall structure includes at least one wall exhibiting an L-shape in a cross-section. The L-shape can be related to the stepped structure described above. The cross-section can be running through the substrate member, the clear encapsulation material, the opaque coating material and the opaque wall structure. The cross-section can run through at least one of the one or more passive optical components, too. The cross-section can be a vertical cross-section.

In some embodiments, the substrate member is opaque for light of the particular range of wavelengths, and the one or more active optical components are, with the exception of the at least one aperture, light-tightly enclosed for light of the particular range of wavelengths by the substrate member, the opaque wall structure and the opaque coating material. When the one or more active optical components are (with the exception of the at least one aperture) completely opaquely covered for light of the particular range of wavelengths by the substrate member, the opaque wall structure and the opaque coating material, undesired light paths can be suppressed.

In some embodiments, the optical device is devoid any hollow inclusions. The term hollow inclusion is meant to say that the inclusion contains a vacuum or a gas or a liquid and is completely surrounded by solid material (of the optical device). Several prior art optical devices which are produced by stacking wafers include large hollow inclusions, e.g., in a space between a section of the lens wafer, a section of the spacer wafer and a section of the substrate wafer.

In some embodiments, the optical device is a dual-channel device, e.g., a proximity sensor. The dual-channel device can include (as the active optical components) at least one light emitter and at least one light sensor. And the opaque wall structure can include walls contributing to an outer housing of the optical device and, in addition, walls which are inner walls of the dual-channel device can optically separate the channels from each other.

The optical device according to the "other variant" include one or more apertures covered by the spectral filter layer material and need not include, in particular do not include, an opaque coating and associated opaque coating material.

E.g., the optical device (according to the "other variant") can include
- a substrate member;
- one or more active optical components operable to emit or sense light of a particular range of wavelengths;
- a clear encapsulation material translucent to light of the particular range of wavelengths;
- a spectral filter layer material;
- an opaque encapsulation material opaque to light of the particular range of wavelengths establishing an opaque wall structure;
- wherein the one or more active optical components are attached to the substrate member, and wherein the clear encapsulation material establishes an overmold for the one or more active optical components and has a face on which the spectral filter layer material is present.

In one embodiment, the opaque encapsulation material establishes one or more aperture stops associated with the one or more active optical components each, the one or more aperture stops delimiting an aperture each, wherein the apertures are covered by the spectral filter layer material.

Any of the aspects described in the following can be combined with the first aspect described above including the "other variant", as far as logically possible. E.g., the following aspects can be implemented as specific embodiments of the first aspect, possibly also in the "other variant". However, they can also be implemented separate therefrom. And, as indicated, the various aspects can also be combined with each other, pairwise, or combining three or more of them.

Second Aspect

This aspect relates to a resilient encapsulation, e.g., to the resilient encapsulation described above already and/or to the resilient encapsulation described elsewhere herein.

The method according to the second aspect is a method for manufacturing optical devices including an active optical component each, the active optical components being optical components for emitting or sensing light of a particular range of wavelengths, wherein the method includes:
- providing an initial wafer including the active optical components and a wafer-size substrate;
- applying a resilient encapsulation to the active optical components by applying to the active optical components a resilient encapsulation material which is resilient and translucent to light of the particular range of wavelengths.

The resilient encapsulation can reduce stress to which the active optical components are exposed, e.g., during further manufacturing steps.

Not only the active optical components themselves, but also electrical connections between the active optical components and the substrate can, in instances, be coated by the resilient encapsulation material. Such electrical connections can be, e.g., wire bonds or solder balls.

Being compliant, the resilient encapsulation can absorb, at least in part, forces otherwise acting on the active optical components and/or on electrical connections between the active optical components and the substrate.

E.g., the resilient encapsulation material can be applied across the substrate. Thus, a wafer-size resilient encapsulation can be produced. It is, however, also possible to apply the resilient encapsulation material only locally to the active optical components.

In some embodiments, the resilient encapsulation material is a silicone, e.g., PDMS.

In some embodiments, the resilient encapsulation material is applied by the aid of a spray coating process.

In some embodiments, the applied resilient encapsulation material is hardened, e.g., cured. This can be accomplished, e.g., by means of irradiation with light such as with UV light. Alternatively or in addition, heat can be applied for accomplishing the hardening.

In some embodiments, the resilient encapsulation material is applied in two or more consecutive spray coating steps.

In some embodiments, the applied resilient encapsulation material is hardened after one or more of such consecutive spray coating steps in addition to a final hardening step at the end of the application of the application of the resilient encapsulation.

In some embodiments, the method includes, after the application of the resilient encapsulation
- applying a clear encapsulation to the active optical components including applying across the substrate a clear encapsulation material which is translucent to light of the particular range of wavelengths.

The clear encapsulation can provide mechanical protection for the active optical components. Furthermore, as described above, passive optical components can be established by the clear encapsulation.

With the resilient encapsulation present, in some embodiments, the clear encapsulation is devoid any direct contact with the substrate. The resilient encapsulation can be separating the clear encapsulation from the wafer-size substrate. In other cases, where the clear encapsulation material is merely locally present, regions exist where the clear encapsulation is in direct contact with the substrate and other regions exist where the clear encapsulation is separated from the wafer-size substrate by the resilient encapsulation.

An optical device according to the second aspect includes
- a substrate member;
- one or more active optical components operable to emit or sense light of a particular range of wavelengths;
- a resilient encapsulation material translucent to light of the particular range of wavelengths;
- wherein the one or more active optical components are attached to the substrate member, and wherein the resilient encapsulation material establishes an overmold for the one or more active optical components.

In some embodiments, the optical device includes, in addition,
- a clear encapsulation material translucent to light of the particular range of wavelengths.

In some embodiments, the clear encapsulation material and the resilient encapsulation material together establish an overmold for the one or more active optical components.

In some embodiments, the clear encapsulation material is separated from the substrate member by the resilient encapsulation material, at least in a region in which the one or more active optical components are present.

Third Aspect

This aspect relates to a coating present on a specifically structured encapsulation, e.g., to the opaque coating described above already and/or to the opaque coating described elsewhere herein, present on the clear encapsulation described above already and/or to the clear encapsulation described elsewhere herein. The encapsulation can be structured to exhibit the described above and/or below described stepped structure.

The method according to the third aspect is a method for manufacturing optical devices, wherein the method includes:
- providing a wafer including a wafer-size substrate on which an encapsulation is present, e.g., on which a clear encapsulation is present which is translucent to light of a particular range of wavelengths;
- applying onto the surface of the encapsulation a coating material, e.g., an opaque coating material;
- producing a coating made of the coating material on the surface of the clear encapsulation, e.g., an opaque coating which is opaque for light of the particular range of wavelengths;
- wherein the encapsulation has a surface at which it has a stepped structure including depressions and/or protrusions limited by steps.

This can stop crack propagation in the coating at the steps. This can protect portions of the coating from delamination, e.g., protect specific structured portions such as portions in which apertures are formed.

The depressions can be grooves.

In some embodiments, the coating has a stepped structure, too. That stepped structure can be a reproduction of the stepped structure of the encapsulation, wherein the reproduction not necessarily needs to be an identical reproduction. E.g., step heights can be different, e.g., by up to a factor of 1.5, and positions of steps can be different, e.g., be displaced by e.g., up to 5 times a thickness of the coating.

In some embodiments, the stepped structure of the coating emerges from applying the coating material onto the surface of the encapsulation material.

In some embodiments, the encapsulation establishes passive optical components, e.g., lenses.

In some embodiments, the surface is a surface facing away from the substrate.

In some embodiments, the coating material is photostructurable.

In some embodiments, the coating has a thickness of between 1 μm and 10 μm.

In some embodiments, producing the (optionally opaque) coating includes structuring the (optionally opaque) coating material.

In some embodiments, producing the (optionally opaque) coating includes hardening the (optionally opaque) coating material.

In some embodiments, the coating defines a multitude of apertures.

In some embodiments, the optical devices include an active optical component each, the active optical components being optical components for emitting or sensing light of the particular range of wavelengths.

In some embodiments, the coating defines a multitude of apertures, each aperture being associated with one of the active optical components and aligned with respect to the respective associated active optical component.

In some embodiments, when the encapsulation includes a multitude of passive optical components (such as lenses), the coating defines a multitude of apertures, each aperture being associated with one of the passive optical components and aligned with respect to the respective associated passive optical component.

In some embodiments, the method includes
- applying a the (optionally clear) encapsulation to the active optical components;
- wherein the applying the encapsulation includes applying across the substrate an encapsulation material, e.g., applying across the substrate a clear encapsulation material which is translucent to light of the particular range of wavelengths.

In some embodiments, the method includes producing the stepped structure in a replication process, e.g., in a molding process such as in a vacuum injection molding process. E.g., a structured replication tool can be used for shaping the encapsulation material so as to exhibit the stepped structure. Alternatively, the method can include producing the stepped structure by removing a portion of the clear encapsulation material. This can be accomplished, e.g., by means of a dicing saw.

In some embodiments, the coating defines a multitude of apertures, and each of the apertures is surrounded by at least one step of the stepped structure.

In some embodiments, the method includes, subsequently to producing the coating,
- producing trenches extending through the (optionally opaque) coating and extending into or through the (optionally clear) encapsulation material.

In some embodiments, the method includes, subsequently to producing the coating,
- producing a wafer-level arrangement of intermediate products, each intermediate product having side walls and including a portion of the (optionally clear) encapsulation (and—if present—one of the active optical components);
- wherein producing the wafer-level arrangement of intermediate products includes producing trenches, wherein the trenches extend through the (optionally clear) encapsulation material and through the (optionally opaque) coating and establish the side walls.

Producing trenches can produce considerable stress in the coating which can lead to delamination problems in the coating. Propagation of corresponding cracks in the coating can be stopped at the steps of the stepped structure.

There can be areas in which the coating is structured, e.g., to form apertures such as the apertures already described or described below, and by means of the steps of the stepped structure, such areas can be protected, e.g., by providing that steps of the stepped structure are present between each of the trenches and each of the areas. E.g., each of the areas can be separated from any of the trenches by at least one region which is free of the opaque coating material.

For example, each of the apertures can be separated from any of the trenches by at least one region which is free of the (optionally opaque) coating material.

In some embodiments, in which the coating establishes apertures and in which trenches are produced, the steps of the stepped structure run along step lines, and between each of the apertures and any of the trenches, one of the step lines is present.

In some embodiments, the method includes producing the stepped structure, and the producing the stepped structure includes producing grooves in the clear encapsulation material. Those grooves can run along the step lines.

In some embodiments, the trenches and the grooves are aligned parallel to each other.

In some embodiments, a thickness of the coating is less than a step height of steps of the stepped structure, e.g., the thickness amounts to less than two times the step height.

An optical device according to the third aspect includes
- an encapsulation material, e.g., a clear encapsulation material translucent to light of a particular range of wavelengths;
- a coating material, e.g., an opaque coating material opaque for light of the particular range of wavelengths;
- wherein the encapsulation material has a face on which the coating material is present, and wherein the encapsulation material has a stepped structure at said face.

In some embodiments, also the coating has a stepped structure, e.g., replicating the stepped structure at the face of the encapsulation material.

In some embodiments, the stepped structure includes at least one depression and/or at least one protrusion limited by at least one step.

In some embodiments, the optical device includes a side wall structure such as, e.g., side walls laterally surrounding the encapsulation material. In this case, steps of the stepped structure can be surrounded by the side wall structure. E.g., any step of the stepped structure can be laterally surrounded by side walls of the side wall structure.

In some embodiments, the coating establishes at least one aperture, and the at least one aperture is laterally separated from the wall structure by steps of the stepped structure.

In some embodiments, the optical device includes a substrate member on which the encapsulation material is present. (This does not exclude that a resilient encapsulation material is located in between, cf., e.g., the second aspect above.)

In some embodiments, the optical device includes
- one or more active optical components operable to emit or sense light of a particular range of wavelengths.

They can be encapsulated in the (optionally clear) encapsulation material.

Fourth Aspect

This aspect relates to trenches, such as, e.g., the already described trenches and/or the trenches described elsewhere herein, which can be filled with an opaque encapsulation material, such as the already described opaque encapsulation material and/or the opaque encapsulation material described elsewhere herein, e.g., so as to make possible to produce optical modules having sides walls made of opaque encapsulation material.

The method according to the fourth aspect is a method for manufacturing optical devices including an active optical component each, the active optical components being optical components for emitting or sensing light of a particular range of wavelengths, wherein the method includes:
- providing a wafer including a wafer-size substrate on which a clear encapsulation is present which is translucent to light of the particular range of wavelengths;
- producing a wafer-level arrangement of intermediate products, each intermediate product having side walls and including a portion of the clear encapsulation and one of the active optical components, the producing the wafer-level arrangement of intermediate products including producing trenches, wherein the trenches extend through the clear encapsulation material and establish the side walls;
- applying an opaque encapsulation to the intermediate products, including applying to the wafer-level arrangement of intermediate products an opaque encapsulation material, thereby filling the trenches, and hardening the opaque encapsulation material, the opaque encapsulation material being opaque to light of the particular range of wavelengths.

This can make possible to produce optical devices which have a desired degree of light tightness.

The trenches can be produced, e.g., by dicing with a dicing saw.

In some embodiments, the trenches extend into, but not through the substrate. This can contribute to reproducibly achieve a high light tightness, e.g., in regions where the trenches are close to or extend into, respectively, the substrate.

If the resilient encapsulation described herein above and below is present, the trenches can extend through the corresponding resilient encapsulation material, too.

In some embodiments, the method includes
- producing singulated optical modules, including cutting through the opaque encapsulation material present in the trenches, the singulated optical modules including one of the intermediate products each, at least one side wall of each respective intermediate product being covered by a respective portion of the opaque encapsulation material.

In some embodiments, the method includes
- applying the clear encapsulation to the active optical components, wherein the applying the clear encapsulation includes applying across the substrate a clear encapsulation material which is translucent to light of the particular range of wavelengths.

In some embodiments, the method includes
- applying onto a surface of the clear encapsulation an opaque coating material which is photostructurable; and
- producing an opaque coating on the surface of the clear encapsulation which is opaque for light of the particular range of wavelengths, wherein the producing the opaque coating includes structuring the opaque coating material.

Therein, the opaque coating can define a multitude of apertures, each aperture being associated with one of the active optical components and aligned with respect to the respective associated active optical component.

Optical devices can be produced this way, which are light-tight (with respect to light of the particular range of wavelengths) except for the one or more apertures defined by the opaque coating material of the optical device.

The producing of the opaque coating can be accomplished before the application of the opaque encapsulation. A possible consequence thereof can be that processes which can be related to the producing of the opaque coating, e.g. processes applied during photostructuring the opaque coating material, such as a spinning process (for applying the opaque coating material) and/or an (optionally wet-chemical) development process, are in that case applied while the clear encapsulation material is still a wafer-size item and not a wafer-level arrangement of intermediate products. This can enhance manufacturability and/or achievable precision. E.g., depending on processes applied, some of the intermediate products could possibly leave their position because of the applied processes and/or relative positions of intermediate products could possibly change because of the applied processes.

A width of the trenches can be between 50 μm and 1000 μm or, in instances, between 100 μm and 800 μm. Such widths can be suitable for producing, on the one hand, optical devices of small lateral dimension and, on the other hand, to reproducibly produce the trenches and fill them with the opaque encapsulation material.

In some embodiments, the application of the opaque encapsulation material is accomplished using a replication technique such as a molding process, e.g., a vacuum injection molding process.

An optical device according to the fourth aspect includes
a substrate member;
one or more active optical components operable to emit or sense light of a particular range of wavelengths;
a clear encapsulation material translucent to light of the particular range of wavelengths;
an opaque wall structure made of an opaque encapsulation material opaque to light of the particular range of wavelengths;
wherein the one or more active optical components are attached to the substrate member, and wherein the clear encapsulation material establishes an overmold for the one or more active optical components, wherein the opaque wall structure is abutting side walls of the clear encapsulation material.

The opaque wall structure can laterally surround the clear encapsulation material.

The device can furthermore include
an opaque coating material opaque for light of the particular range of wavelengths, defining at least one aperture associated with the one or more active optical components.

In some embodiments, a thickness of the substrate member in a first region in which the opaque wall structure abuts the substrate member is smaller than a thickness of the substrate member in a second region encircled by the first region. This can contribute to an enhanced light-tightness of the optical device.

In some embodiments, a vertical extension of the opaque coating material can overlap with a vertical extension of the opaque encapsulation material of the opaque wall structure. In instances, a vertical extension of the opaque coating material can be included in a vertical extension of the opaque encapsulation material of the opaque wall structure.

In some embodiments, a vertical extension of the opaque coating material can (e.g., in a direction pointing away from the substrate member) terminate together with a vertical extension of the opaque encapsulation material of the opaque wall structure.

In some embodiments, the opaque wall structure includes at least one wall exhibiting an L-shape in a cross-section. This can be the case, e.g., when the clear encapsulation material exhibits a stepped structure, e.g., when the fourth aspect is combined with the third aspect (cf. above).

In some embodiments, the opaque wall structure includes at least one wall exhibiting (at least substantially) a T-shape in a cross-section. This can be the case, e.g., when the clear encapsulation material exhibits a stepped structure, e.g., when the fourth aspect is combined with the third aspect (cf. above). Furthermore, this can be the case if the optical device includes at least two intermediate products and/or is a multi-channel device (thus having at least two channels).

Fifth Aspect

This aspect relates to ways of reducing stress in wafer-level manufacturing and to corresponding wafer-level manufactured devices. This can find application, e.g., in other methods described herein such as the described methods for manufacturing optical devices. And the wafer-level manufactured devices can be, e.g., the optical devices described herein.

This aspect can, e.g., relate to producing cuts in the opaque encapsulation such as described above or elsewhere in the present patent application.

The method according to the fifth aspect can be a method for manufacturing optical devices including an active optical component each, the active optical components being optical components for emitting or sensing light of a particular range of wavelengths, wherein the method includes:
providing an initial wafer including the active optical components and a wafer-size substrate;
applying a clear encapsulation to the active optical components including applying across the substrate a clear encapsulation material which is translucent to light of the particular range of wavelengths;
producing a wafer-level arrangement of intermediate products, each intermediate product having side walls and including a portion of the clear encapsulation and one of the active optical components, the producing the wafer-level arrangement of intermediate products including producing trenches, wherein the trenches extend through the clear encapsulation material and establish the side walls;
applying an opaque encapsulation to the intermediate products, including applying to the wafer-level arrangement of intermediate products an opaque encapsulation material, thereby filling the trenches, and hardening the opaque encapsulation material, the opaque encapsulation material being opaque to light of the particular range of wavelengths;
producing cuts in the opaque encapsulation while preserving the clear encapsulation and the arrangement of intermediate products uncut by the cut and in particular unsegmented;
producing singulated optical modules, including cutting through the opaque encapsulation material present in the trenches, the singulated optical modules including one of the intermediate products each, at least one side wall of each respective intermediate product being covered by a respective portion of the opaque encapsulation material.

Producing the cuts can preserve also the opaque encapsulation unsegmented.

Producing the cuts can be accomplished after the applying of the opaque encapsulation material, before the producing of the singulated modules. It can be accomplished, e.g., after the applying the opaque encapsulation.

In instances, after producing the cuts, a heat treatment is applied to the wafer, e.g., a heat treatment carried out before producing the cuts. This heat treatment can be carried out, e.g., after the wafer has been removed from a replication tool for shaping the opaque encapsulation material (cf. above).

The cuts can run along cut lines.

In some embodiments, the cuts extend only partially into the opaque encapsulation material present in the trenches.

In some embodiments, the cuts are laterally positioned within lateral positions of the trenches.

In some embodiments, the method includes
applying onto a surface of the clear encapsulation an opaque coating material, wherein the opaque coating material can be photostructurable; and
producing an opaque coating on the surface of the clear encapsulation which is opaque for light of the particular range of wavelengths and which defines a multitude of apertures, each aperture being associated with one of the active optical components and aligned with respect to the respective associated active optical component, wherein the producing the opaque coating includes structuring the opaque coating material.

These steps can be accomplished, e.g., after applying the clear encapsulation and prior to the producing the wafer-level arrangement of intermediate products.

A device according to the fifth aspect, which can, e.g., be an optical device, includes a substrate member;

one or more active optical components operable to emit or sense light of a particular range of wavelengths;

a clear encapsulation material translucent to light of the particular range of wavelengths;

an opaque wall structure made of an opaque encapsulation material opaque to light of the particular range of wavelengths;

wherein the one or more active optical components are attached to the substrate member, and wherein the clear encapsulation material establishes an overmold for the one or more active optical components, and wherein at least one cut it present which extends into the opaque wall structure.

In some embodiments, the at least one cut extends only partially into (and thus not through) the opaque encapsulation material of the opaque wall structure.

In some embodiments, the at least one cut does not extend into the clear encapsulation material. In other words, the at least one cut is located at a distance to the clear encapsulation material.

In some embodiments, the at least one cut is located at an outside edge of the device.

The device can furthermore include an opaque coating material opaque for light of the particular range of wavelengths, defining at least one aperture associated with the one or more active optical components.

Sixth Aspect

This aspect relates to an application of a spectral filter layer, e.g., to the spectral filter layer described above already and/or to the spectral filter layer described elsewhere herein. More specifically, the sixth aspect relates to the "other variant" of the invention already introduced above, in which the spectral filter layer material is applied onto the surface of the clear encapsulation before the opaque encapsulation is applied (and, possibly, also before the wafer-level arrangement of intermediate products is produced).

In the sixth aspect, the method is a method for manufacturing optical devices including an active optical component each, the active optical components being optical components for emitting or sensing light of a particular range of wavelengths, and the method includes:

providing an initial wafer including the active optical components and a wafer-size substrate;

applying a clear encapsulation to the active optical components including applying across the substrate a clear encapsulation material which is translucent to light of the particular range of wavelengths;

applying onto a surface of the clear encapsulation a spectral filter layer material;

producing a spectral filter layer on the surface of the clear encapsulation, wherein the producing the spectral filter layer includes structuring the spectral filter layer material;

producing a wafer-level arrangement of intermediate products, each intermediate product having side walls and including a portion of the clear encapsulation and one of the active optical components, the producing the wafer-level arrangement of intermediate products including producing trenches, wherein the trenches extend through the clear encapsulation material and establish the side walls;

applying an opaque encapsulation to the intermediate products, including applying to the wafer-level arrangement of intermediate products an opaque encapsulation material, thereby filling the trenches, and hardening the opaque encapsulation material, the opaque encapsulation material being opaque to light of the particular range of wavelengths;

In particular, the spectral filter layer can define a multitude of apertures, each aperture being associated with one of the active optical components and aligned with respect to the respective associated active optical component, and the encapsulation material can establish a multitude of aperture stops mating the apertures defined by the spectral filter layer.

The method can in addition include producing singulated optical modules, including cutting through the opaque encapsulation material present in the trenches, the singulated optical modules including one of the intermediate products each, at least one side wall of each respective intermediate product being covered by a respective portion of the opaque encapsulation material.

Structuring the spectral filter layer material can, e.g., be accomplished photolithographically.

By structuring the spectral filter layer material, patches of the spectral filter layer material can be produced. Those patches can define the apertures.

In some embodiments, the applying the spectral filter layer includes a hardening step, such as, e.g., irradiation with light such as with UV light, and/or applying a heat treatment.

The spectral filter layer can remain unchanged by the producing of the trenches.

In instances, the trenches are only present in locations which are free from overlap with the spectral filter layer.

This can prevent delamination of the spectral filter layer material caused by producing the trenches.

The spectral filter layer can be translucent for light of the particular range of wavelengths.

The spectral filter layer can be opaque for light of a range of wavelengths outside the particular range of wavelengths.

In some embodiments, the spectral filter layer constitutes an IR filter.

As will be appreciated, the sixth aspect can inherit various features and steps from other methods herein described. However, when the opaque coating is dispensed with, features and steps concerning the opaque coating cannot be applied or have to be replaced by analogous features and steps not relating to the opaque coating.

Seventh Aspect

This aspect relates to details of shaping an opaque encapsulation material, e.g., to the opaque encapsulation material described above already and/or to the opaque encapsulation material described elsewhere herein.

The method according to the seventh aspect is a method for manufacturing optical devices including an active optical component each, the active optical components being optical components for emitting or sensing light of a particular range of wavelengths, wherein the method includes:

providing an initial wafer including the active optical components and a wafer-size substrate;

applying a clear encapsulation to the active optical components including applying across the substrate a clear encapsulation material which is translucent to light of the particular range of wavelengths;

applying onto a surface of the clear encapsulation an opaque coating material which can be, e.g., photostructurable;

producing an opaque coating on the surface of the clear encapsulation which is opaque for light of the particular range of wavelengths and which defines a multitude of apertures, each aperture being associated with one of the active optical components and aligned with respect to the respective associated active optical component, wherein the producing the opaque coating includes structuring the opaque coating material;

producing a wafer-level arrangement of intermediate products, each intermediate product having side walls and including a portion of the clear encapsulation and one of the active optical components, the producing the wafer-level arrangement of intermediate products including producing trenches, wherein the trenches extend through the clear encapsulation material and establish the side walls;

applying an opaque encapsulation to the intermediate products, including applying to the wafer-level arrangement of intermediate products an opaque encapsulation material, thereby filling the trenches, and hardening the opaque encapsulation material, the opaque encapsulation material being opaque to light of the particular range of wavelengths;

wherein applying of the opaque encapsulation includes shaping the opaque encapsulation material in a replication process using a replication tool including a surface including a replication surface for shaping the opaque encapsulation material; and pressing the replication surface against the opaque coating while shaping the opaque encapsulation material.

And during the pressing, a multitude of hollows is established and a multitude of seals is established, each of the seals completely surrounding one of the hollows and preventing that any of the opaque encapsulation material enters the respective surrounded hollow. And each of the hollows encloses one of the apertures, and each of the seals is formed by a respective section of the opaque coating abutting a respective section of the surface of the replication tool.

Accordingly, during shaping the opaque encapsulation material, the opaque encapsulation interacts with the replication tool (and more precisely with sections of the surface of the replication tool) in order to prevent a penetration of the opaque encapsulation material into certain regions, namely into the hollows formed.

Contamination or damage of the apertures by the opaque encapsulation material can be avoided.

Use of a flat (unstructured) surface of the replication tool can be made possible this way. And precise lateral adjustment of the replication tool for accomplishing the shaping of the opaque encapsulation material can, in instances, be dispensed with when using a replication tool whose surface includes the replication surface is a flat (unstructured) surface.

In some embodiments, the surface of the replication tool including the replication surface is flat (unstructured).

In instances, the replication tool is a resilient replication tool including at least one resilient inner wall. E.g., the resilient inner wall can include the surface of the replication tool including the replication surface.

The shaping of the opaque encapsulation material can include a vacuum injection molding process.

In some embodiments, passive optical components (such as, e.g., lenses) established by the clear encapsulation contribute to delimiting the hollows.

In some embodiments, the method includes producing singulated optical modules, including cutting through the opaque encapsulation material present in the trenches, the singulated optical modules including one of the intermediate products each, at least one side wall of each respective intermediate product being covered by a respective portion of the opaque encapsulation material.

In some embodiments, each of the hollows is confined by a portion of the clear encapsulation material, wherein the portion can, in instances, include a passive optical component formed by the clear encapsulation material;

a portion of the opaque coating; and a portion of the replication surface.

And in instances, each of the hollows is confined by no more than these three items.

The device according to the seventh aspect is an optical device including a substrate member;

one or more active optical components operable to emit or sense light of a particular range of wavelengths;

a clear encapsulation material translucent to light of the particular range of wavelengths;

an opaque coating material opaque for light of the particular range of wavelengths, defining at least one aperture associated with the one or more active optical components;

an opaque wall structure made of an opaque encapsulation material opaque to light of the particular range of wavelengths;

wherein the one or more active optical components are attached to the substrate member, and wherein the clear encapsulation material establishes an overmold for the one or more active optical components, and wherein a face of the opaque coating material facing away from the clear encapsulation material is arranged in a first plane which is aligned parallel to a lateral plane (horizontal plane) defined by the substrate member, and wherein the opaque wall structure has a further face which is arranged in the first plane, too.

The further face can be facing away from the substrate member.

The face of the opaque coating can be adjoining the further face of the opaque encapsulation material.

It can contribute to the mechanical stability of the optical device when the opaque encapsulation material of the opaque wall structure and the opaque coating both extend to a common plane. E.g., the opaque wall structure can provide a sideways mechanical protection for the opaque coating.

Eighth Aspect

This aspect relates to optical devices including two different opaque materials, one of them defining an aperture, wherein the opaque materials are abutting and/or overlapping, and to ways of manufacturing the optical devices. The optical device can be, e.g., the optical devices described above already and/or the optical devices described elsewhere herein. And the two different opaque materials can be, e.g., the opaque coating material and the opaque encapsulation materially described above already and/or described elsewhere herein.

The method according to the eighth aspect is a method for manufacturing optical devices including an active optical component each, the active optical components being optical components for emitting or sensing light of a particular range of wavelengths, wherein the method includes:

applying an opaque coating material, wherein the opaque coating can be, e.g., photostructurable;

producing an opaque coating which is opaque for light of the particular range of wavelengths and which defines a multitude of apertures, each aperture being associated with one of the active optical components and aligned with respect to the respective associated active optical component, wherein the producing the opaque coating includes structuring the opaque coating material;

applying an opaque encapsulation, including applying an opaque encapsulation material and hardening the opaque encapsulation material, the opaque encapsulation material being opaque to light of the particular range of wavelengths;

wherein the opaque encapsulation material is applied to abut the opaque coating.

The opaque coating material can make possible to reproducibly achieve high-precision apertures having a high-precision alignment. Selecting a photostructurable opaque coating material can contribute thereto and selecting a low thickness of the opaque coating can contribute thereto, too.

The opaque encapsulation which, e.g., can be a hardenable polymer material, e.g., a curable epoxy, can provide mechanical stability of the optical device. It can establish an opaque wall structure which, e.g., can establish side walls of the optical device.

In instances, the opaque encapsulation is applied after producing the opaque coating.

In instances, the opaque coating has a multitude of regions including at least one of the apertures each, and the opaque encapsulation is applied only outside said regions.

The opaque encapsulation and the opaque coating can overlap each other, which can contribute to an enhanced light tightness of the optical device (at least as far as the particular range of wavelengths is concerned). E.g., if the opaque coating is produced on a surface of a clear encapsulation material, and the clear encapsulation material is applied across a wafer-size substrate, e.g., across a substrate included in an initial wafer (the initial wafer including the substrate and the active optical components), the following can apply: Laterally defined regions exist in which a sequence of materials along a vertical direction pointing away from the substrate is: clear encapsulation material/opaque coating material/opaque encapsulation material. Furthermore, the achievable light tightness can be particularly enduring in the sense that it can continue to exist still after exposure of respective optical devices to thermal and/or mechanical stress.

In some embodiments, the method includes providing an initial wafer including the active optical components and a wafer-size substrate;

applying a clear encapsulation to the active optical components including applying across the substrate a clear encapsulation material which is translucent to light of the particular range of wavelengths;

wherein the opaque coating material is applied onto a surface of the clear encapsulation, and wherein the opaque coating is produced on the surface of the clear encapsulation.

In some embodiments, the method includes producing a wafer-level arrangement of intermediate products, each intermediate product having side walls and including a portion of the clear encapsulation and one of the active optical components, the producing the wafer-level arrangement of intermediate products including producing trenches, wherein the trenches extend through the clear encapsulation material and establish the side walls;

wherein the opaque encapsulation is applied to the intermediate products, and wherein the opaque encapsulation material is applied to the wafer-level arrangement of intermediate products and thereby fills the trenches.

In some embodiments, the method includes producing singulated optical modules, including cutting through the opaque encapsulation material present in the trenches, the singulated optical modules including one of the intermediate products each, at least one side wall of each respective intermediate product being covered by a respective portion of the opaque encapsulation material.

In some embodiments, the opaque encapsulation material is applied in a vacuum injection molding process.

In some embodiments, the opaque coating material is applied by spray coating.

In some embodiments, the opaque coating material is photolithographically structured.

An optical device according to the eighth aspect includes a substrate member;

one or more active optical components operable to emit or sense light of a particular range of wavelengths;

a clear encapsulation material translucent to light of the particular range of wavelengths;

an opaque coating material opaque for light of the particular range of wavelengths, defining at least one aperture associated with the one or more active optical components;

an opaque wall structure made of an opaque encapsulation material opaque to light of the particular range of wavelengths;

wherein the one or more active optical components are attached to the substrate member, and wherein the opaque coating material and the opaque encapsulation material are overlapping.

In some embodiments, alternatively to the overlapping or in addition thereto, it applies that at least one laterally defined region exists in which a sequence of materials along a vertical direction pointing away from the substrate member is:

clear encapsulation material;

opaque coating material;

opaque encapsulation material.

Of course, the term "lateral" as used here indicates directions which are parallel to a plane (lateral plane/horizontal plane) defined by the substrate member; and "vertical" indicates a direction perpendicular to said plane (and thus perpendicular to any lateral direction).

In some embodiments, the clear encapsulation material establishes an overmold for the one or more active optical components.

In some embodiments, the at least one laterally defined region laterally encircles the at least one aperture.

Further embodiments emerge from the dependent claims and the figures. As will be appreciated, further features and details of the various aspects have been described above and are described further below.

Figure 6D:
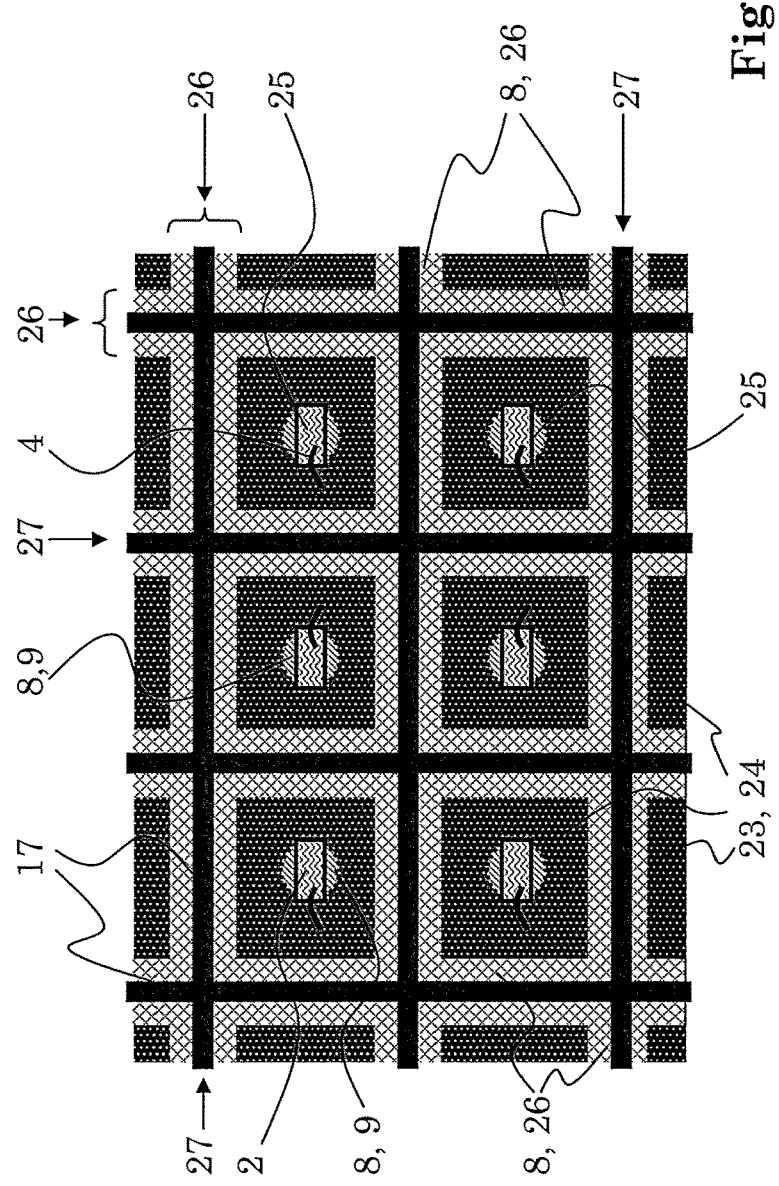
Figure 11:
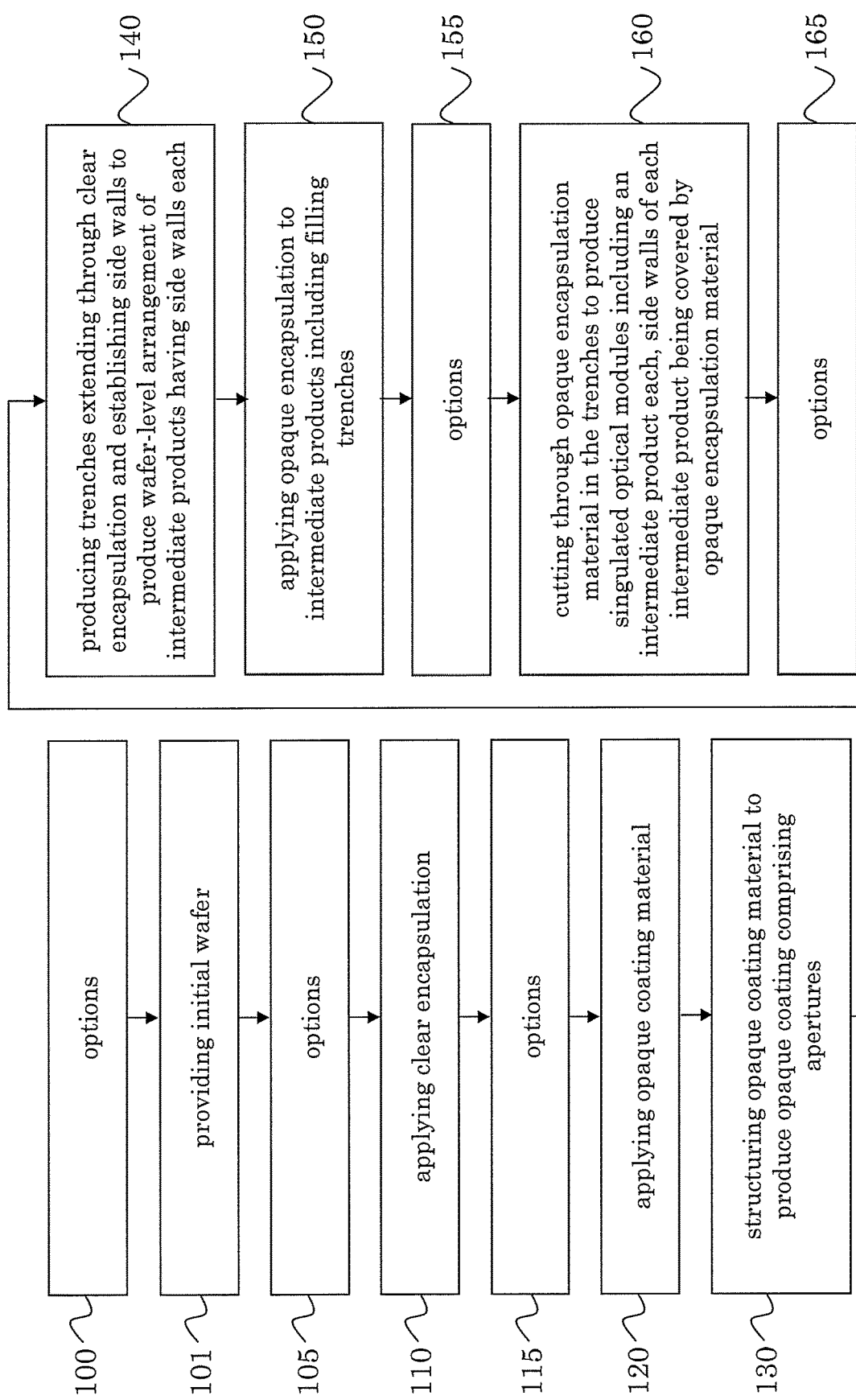
Figure 19:
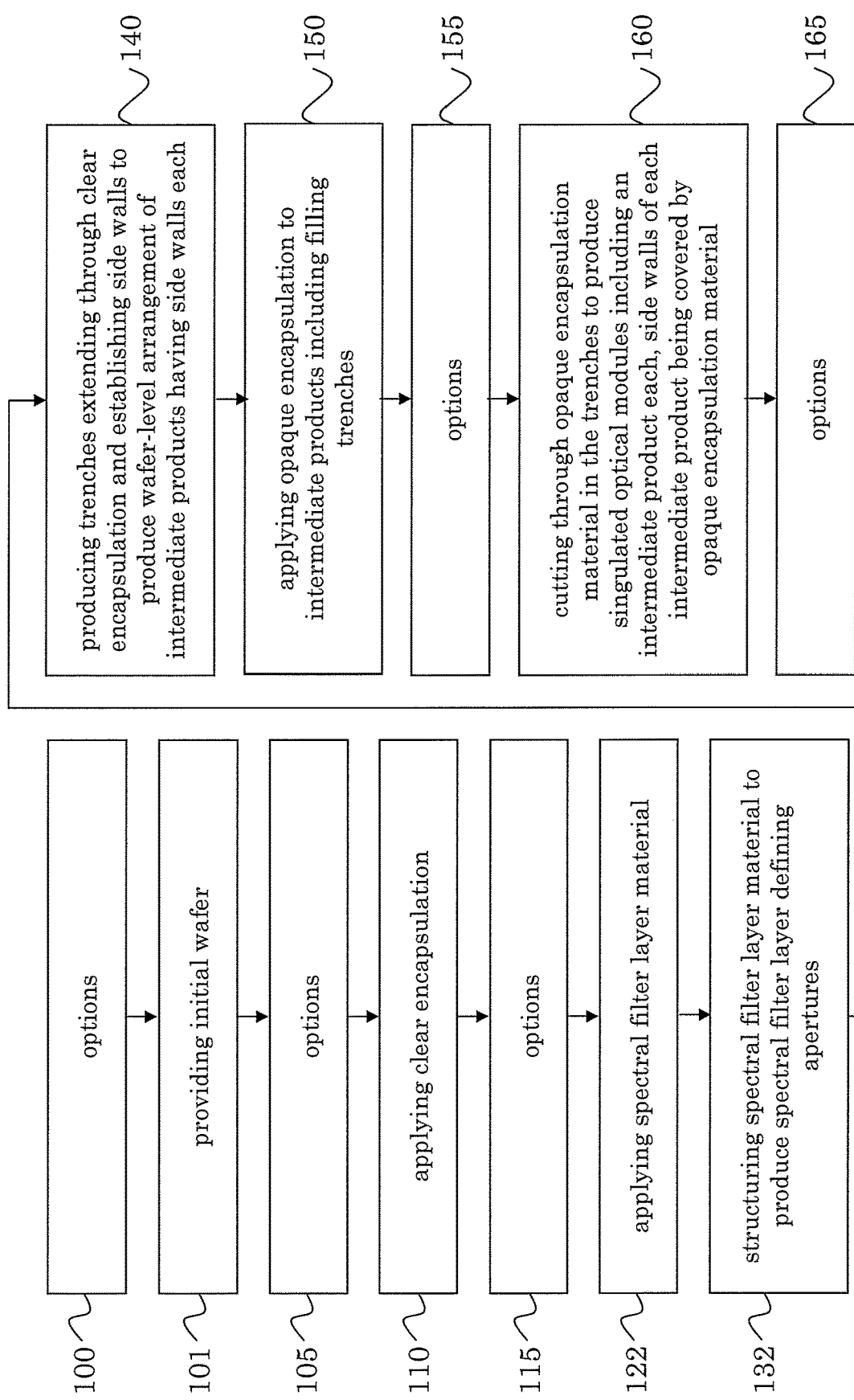

Below, the invention is described in more detail by means of examples and the included drawings. The figures show schematically:

FIG. 1A a cross-sectional view an initial wafer;

FIG. 1B a cross-sectional view an initial wafer including an artificial wafer;

FIG. 1C a cross-sectional view an initial wafer including a contacting board;

FIG. 1D a cross-sectional view an initial wafer including a semiconductor wafer;

FIG. 1E a cross-sectional illustration of a carrier assembly;

FIG. 2 a cross-sectional view of a resiliently coated wafer;

FIG. 3 a cross-sectional view of a clear encapsulation wafer;

FIG. 4 a cross-sectional view of the clear encapsulation wafer of FIG. 3 and a replication tool;

FIG. 4A a cross-sectional view of a carrier assembly and of a mold for molding the clear encapsulation;

FIG. 5A a cross-sectional view of a step-structured wafer;

FIG. 5B a detail of the step-structured wafer of FIG. 5A in a top view;

FIG. 5C a cross-sectional view of a replication tool and of a step-structured wafer shaped by the replication tool;

FIG. 6A a cross-sectional view of a wafer in a not-finalized state, namely with unstructured opaque coating material on a surface of the clear encapsulation material;

FIG. 6B a cross-sectional view of an opaque coating wafer, as can be obtained by structuring the opaque coating material of the wafer of FIG. 6A;

FIG. 6C a cross-sectional view of an opaque coating wafer having an opaque coating which is structured in a particular way;

FIG. 6D a top view of a detail of the opaque coating wafer of FIG. 6C;

FIG. 7 a cross-sectional view of a trenched wafer;

FIG. 8 a cross-sectional view of a detail of an opaque encapsulation wafer, e.g., as obtainable from the trenched wafer of FIG. 7 by application of an opaque encapsulation material;

FIG. 9 a cross-sectional view of a detail of a wafer with cuts in the opaque encapsulation, e.g., as obtainable from the opaque encapsulation wafer of FIG. 8;

FIG. 9A a cross-sectional view of a detail of a substrate arrangement with furrows through the opaque encapsulation wafer, e.g., as obtainable from the opaque encapsulation wafer of FIG. 8;

FIG. 9B a schematized top view of a portion of the substrate arrangement of FIG. 9A;

FIG. 10 a cross-sectional view a detail of a wafer-level arrangement of singulated optical modules on which a spectral filter layer is present;

FIG. 11 a flow chart of an example of a method for manufacturing optical devices on wafer-level;

FIG. 12A a cross-sectional view of a single-channel optical device devoid a passive optical component and devoid a step structure of the clear encapsulation;

FIG. 12B a cross-sectional view of an optical device corresponding to the one of FIG. 12A, but wherein the active optical component is resiliently encapsulated by a resilient encapsulation material;

FIG. 12C a cross-sectional view of an optical device corresponding to the one of FIG. 12A, but wherein a passive optical component is established by the clear encapsulation material;

FIG. 12D a cross-sectional view of an optical device corresponding to the one of FIG. 12C, but wherein the active optical component is included in a substrate part originating from an artificial wafer;

FIG. 12E a cross-sectional view of an optical device corresponding to the one of FIG. 12A, but wherein the clear encapsulation is stepped;

FIG. 12F a cross-sectional view of an optical device corresponding to the one of FIG. 12E, but including a passive optical component and a spectral filter layer;

FIG. 12G a cross-sectional view of a dual-channel optical device including one passive optical component per channel and having in both channels a step structure of the clear encapsulation;

FIG. 13A a cross-sectional illustration of a carrier assembly to which a temporary layer has been applied FIG. 13B a cross-sectional illustration of a singulated modules obtained by singulation on the temporary layer of FIG. 13A;

FIG. 14 a cross-sectional view of a detail of a clear encapsulation wafer on which spectral filter layer material is applied, according to the "other variant" of the invention;

FIG. 15 a cross-sectional view of a detail of a clear encapsulation wafer on which a spectral filter layer is present, according to the "other variant" of the invention;

FIG. 16 a cross-sectional view of a detail of a trenched wafer, according to the "other variant" of the invention;

FIG. 17 a cross-sectional view of a detail of an opaque encapsulation wafer, e.g., as obtainable from the trenched wafer of FIG. 16 by application of an opaque encapsulation material, according to the "other variant" of the invention;

FIG. 18 a cross-sectional view of a dual-channel optical device including no passive optical components and no baffles, according to the "other variant" of the invention;

FIG. 19 a flow chart of an example of a method for manufacturing optical devices on wafer-level according to the "other variant" of the invention.

The described embodiments are meant as examples or for clarifying the invention and shall not limit the invention.

In the following, a particularly elaborate method is described which has various options and variants which can be but not necessarily need to be part of the claimed invention.

By means of the described method, devices, more specifically optical devices, can be manufactured on wafer level.

All figures are schematical drawings only.

FIG. 1A depicts in a cross-sectional view an initial wafer 1a including a multitude of active optical components 2 and a wafer-size substrate 3.

Each of the active optical components 2 can be a light emitter, e.g., a light-emitting diode (LED), a vertical-cavity surface-emitting laser (VCSEL), an edge-emitting laser, an array of any of the preceding elements, and/or any combination of any of the preceding elements.

The light emitters can be operable to emit modulated light, such as spatially modulated light or temporally modulated light.

The light emitters can be operable to produce light of a particular range of wavelengths, e.g., infrared light (IR), ultraviolet light (UV), or visible light. E.g., they can be operable to produce a selection of one or more spans of infrared (IR) or of ultraviolet (UV) or of visible light.

In other cases, each of the active optical components 2 can be a light detector, e.g., a photodiode (PD), a complementary metal-oxide-semiconductor device (CMOS device), a charge-coupled device (CCD), a demodulation pixel, an array of any of the preceding elements, and/or any combination of any of the preceding elements.

The light detectors can be operable to detect modulated light, such as spatially modulated light or temporally modulated light.

The light detectors can be operable to detect light of a particular range of wavelengths, e.g., infrared light (IR), ultraviolet light (UV), or visible light. E.g., they can be operable to detect a selection of one or more particular spans of infrared (IR) or of ultraviolet (UV) or of visible light.

It is noted that it is not excluded by the above that the active optical component 2 can be operable to emit and detect, respectively, also light of further ranges of wavelengths (in addition to said particular range of wavelengths).

Said particular range of wavelengths can be, e.g., in the IR range, e.g., between 800 nm and 900 nm, such as in the range 850 nm±20 nm.

In case single-channel devices are manufactured, all active optical components 2 can be but do not have to be congeneric active optical components, e.g., either all light emitters or all light detectors.

In case of dual-channel devices, a portion of the active optical components 2 can be light emitters while another portion of the active optical components 2 can be light detectors. E.g., one half of the multitude of active optical components 2 can be light emitters and the other half can be light detectors.

The active optical components can be bare dies. In an alternative, the active optical components 2 can be packaged components, e.g., chip-scale packages.

Substrate 3 can have a very small thickness (vertical extension, z-height), e.g., of below 200 μm and even below 100 μm. In specific cases, the thickness can be below 70 μm or even below 50 μm.

In contrast to manufacturing methods which start with a thicker wafer to be thinned during (or at the end of) the manufacturing method, such a thinning step can possibly dispensed with, when starting with a thin initial wafer and with a thin substrate, respectively.

It can be provided that substrate 3 is not self-supporting. This can be due to the choice of materials of substrate 3 and/or due to a low thickness of substrate 3.

Substrate 3 can be plate-shaped. E.g., substrate 3 can have two opposing and mutually parallel substrate surfaces. A surface area of these substrate surfaces can be larger than a surface area of any other surface of the substrate. Substrate 3 can be devoid any openings.

Substrate 3 can include a contiguous dielectric body, e.g., a polymer or polymer compound body, wherein the polymer can be, e.g., an epoxy resin or a polyimide. The body can be fiber-reinforced.

Substrate 3 can be a printed circuit board (PCB).

Active optical components 2 can be mounted on and electrically connected to substrate 3, e.g., by wirebonds 4 or by solder balls (not illustrated in FIG. 1A).

In other cases, substrate 3 can include an artificial wafer. The artificial wafer is composed of a multitude of semiconductor chips (e.g., of bare dies or chip-scale packages constituting the active optical components 2) which are mechanically interconnected to form a contiguous wafer by an interconnection frame 5, e.g., the interconnection frame can be grid-shaped, with the active optical components 2 being located in (and filling) holes formed by the grid. Interconnection frame 5 can be made of a dielectric, e.g., of a polymer material, such as an epoxy resin.

Substrate 3 can includes the active optical components 2, and in this case, initial wafer 1a can be identical with substrate 3. This can be the case, e.g., when substrate 3 includes an artificial wafer.

FIG. 1B depicts in a cross-sectional view an initial wafer 1a including a multitude of active optical components 2 and a wafer-size substrate 3 which includes an artificial wafer. The artificial wafer can be manufactured using a molding process in which the active optical components 2 are at their vertical sides embedded in a molding compound, e.g., in the polymer material.

In other cases, substrate 3 can be a contact board. The contact board is composed of a multitude of electrically conductive plates 3a, 3b (e.g., of metal plates such as copper plates) which are mechanically interconnected by an interconnection frame 3c to form a contiguous plate-shaped board, e.g., similar to the interconnection frame 5 of the artificial wafer described in connection with FIG. 1B. The interconnection frame 3c can describe a grid, with the electrically conductive plates 3a, 3b located in (and filling) holes formed by the grind. The interconnection frame 3c can be made of a dielectric, e.g., of a polymer material, such as an epoxy resin.

Like a wafer, also the contact board is a substantially disk- or plate-like shaped item, its extension (thickness) in one direction (z-direction or vertical direction) is small with respect to its extension (width) in the other two directions (x- and y-directions or lateral directions or horizontal directions). The electrically conductive plates 3a, 3b can extend fully across the thickness of the contact board. The thickness of the contact board can be identical at the electrically conductive plates 3a and at the interconnecting frame 3c, however, this not necessarily has to be the case.

As illustrated in FIG. 1C, there can be two kinds of electrically conductive plates: electrically conductive plates 3a and electrically conductive plates 3b. Electrically conductive plates 3a and electrically conductive plates 3b are mechanically interconnected with each other but electrically insulated from each other by interconnection frame 3c.

On each electrically conductive plate 3a, an active optical component 2 is mounted, which can be in electrical and/or in thermal contact with the respective electrically conductive plate 3a. And each of the active optical components 2 is in electrical contact with one of the electrically conductive plates 3b, e.g., by a wirebond 4.

Electrically conductive plates 3a can be solid metal plates. This can improve heat dissipation from the respective active optical components 2 connected thereto.

Electrically conductive plates 3b can be solid metal plates, too.

The electrically conductive plates 3a, 3b can be considered through-contacts or solid vias of the contact board.

In contrast to standard PCBs, the contact board can be devoid of any conductor track in the sense of being devoid of any laterally running electrical connection present on a dielectric interconnection frame interconnection frame 3c, e.g., electrically interconnecting two through-contacts.

In other cases, substrate 3 can be a semiconductor wafer, e.g., a silicon wafer, including the active optical components 2, cf., e.g., FIG. 1D.

When substrate 3 is a semiconductor wafer, initial wafer 1a can be identical with substrate 3.

The semiconductor wafer can be a single-piece semiconductor wafer.

The semiconductor wafer can have through-silicon vias (TSVs) such that it has electrical connections between its main faces, i.e. across its thickness.

FIG. 1D depicts in a cross-sectional view an initial wafer 1a including a multitude of active optical components 2 and a wafer-size substrate 3 which is a semiconductor wafer.

In the following, for simplicity, initial wafer 1a and substrate 3 will mostly be illustrated like depicted in FIG. 1A, wherein substrate 3 constitutes, e.g., a PCB. However, other initial wafers 1a and substrates 3, e.g., as depicted in FIG. 1B, could be applied in the following, too, at least in most instances.

In FIG. 1D, a coordinate system indicating lateral directions x, y and vertical direction z is sketched which is applicable also to the other cross-sectional views.

During various processing steps, the initial wafer 1a and its successor wafers (cf. below) can be attached to a carrier wafer, e.g., like illustrated in FIG. 1E, to carrier wafer 6. A carrier assembly 66 in which a wafer to be processed is attached to a carrier wafer 6 can contribute to minimizing stress to which the wafer is exposed. E.g., bending of the wafer can be prevented to a large extent. The wafer, such as initial wafer 1a, can be attached to carrier wafer 6, e.g., by means of a double-sided adhesive tape 65.

E.g., tape 65 can be a high-temperature tape, i.e. a tape which strongly reduces its adhesive properties in reaction to application of heat.

Carrier wafer 6 can be rigid.

Carrier wafer 6 can be made of, e.g., glass.

As will be described below, the carrier assembly can remain assembled, e.g., up to a singulation step or more precisely up to a transfer of the wafer to another layer such as the temporary layer described further below on which the wafer will be separated into separate optical modules, e.g., by dicing.

For reasons explained below and as illustrated in FIG. 1E, it can be provided that the carrier wafer 6 circumferentially laterally protrudes beyond the wafer or the substrate 3, and it can also circumferentially laterally protrude beyond the tape 65. And furthermore, also tape 65 can circumferentially laterally protrude beyond the wafer or beyond the substrate 3.

If initial wafer 1a includes a substrate 3 on which active optical components 2 need to be assembled, e.g., by pick-and-place, the assembling can be accomplished while the substrate 3 is included in the carrier assembly.

Alternatively, substrate 3 can be attached to an initial tape during the assembly.

In order to be able to process the assembled (initial) wafer while it is attached to carrier wafer 6 (so as to form carrier assembly 66), a transfer from the initial tape to carrier wafer 6 (or to tape 65) has to be accomplished.

In order to minimize stress during such a transfer, bending of substrate 3 and of the initial wafer 1a, respectively, should be avoided as far as possible.

One way to accomplish this aim is to attach the initial wafer 1a to a special vacuum chuck after assembly. The vacuum chuck has a plurality of openings at which an underpressure can be applied, and these opening are distributed across the initial wafer 1a. In addition, in a peripheral portion of the substrate, where no active optical components are present, the vacuum chuck can have one or more further openings at which underpressure can be applied and which can be arranged, e.g., continuously or section-wise surrounding the active optical components of initial wafer 1a.

In order to provide space where the openings can get in contact with the substrate 3, blank spaces can be provided on the substrate 3, interdispersed between the active optical components.

The openings can be located at ends of protruding portions of the vacuum chuck, so as to avoid undesired mechanical contacts between the vacuum chuck and the initial wafer, e.g., at the active optical components or at other parts not to be touched.

For facilitating alignment between the vacuum chuck and the initial wafer, alignment marks such as fiducials can be present at the initial wafer. The alignment marks can be viewed by one or cameras through viewing openings of the vacuum chuck.

The transfer from the initial tape to the carrier wafer 6 (or to tape 65) can be accomplished as follows: The vacuum chuck is laterally aligned with respect to the initial wafer, e.g., by the aid of the alignment marks. Then, the vacuum chuck and the initial wafer (such as substrate 3) are brought into contact, and underpressure is applied.

This way, initial wafer 1a is held by the vacuum chuck, and the initial tape (present on the opposite side of substrate 3) can be removed. The initial tape can be, e.g., a UV tape which strongly reduces its adhesive properties in reaction to exposure to UV radiation. In that case, removal of the initial tape can be facilitated by UV irradiation.

Then, while still being held by the vacuum chuck, the carrier wafer 6 can be attached to the initial wafer 1a, e.g., by providing tape 65 in between them. Thereafter, the underpressure can be removed and the vacuum chuck can be removed from the initial wafer 1a.

Even though, the wafer can be assembled in the carrier assembly 66 during following processing steps, the carrier wafer 6 and tape 65 are in various cases not illustrated in the figures.

FIG. 2 depicts in a cross-sectional view a resiliently coated wafer 1b obtained by applying a resilient encapsulation material 7 to the initial wafer 1a (cf. FIG. 1A), thus producing a resilient encapsulation of the active optical components 2. The resilient encapsulation can be optional.

Resilient encapsulation material 7 is resilient and can therefore provide some protection for active optical components 2 and in particular reduce mechanical stress exerted on active optical components 2 and on electrical connections thereof such as on the wirebonds 4. The mechanical stress can be due to temperature changes in combination with different coefficients of thermal expansion (CTEs) of the materials involved and/or due to response of materials involved to changes in humidity. The temperature changes and changes in humidity can occur, e.g., by heat treatments during further manufacturing steps or during use of the finished product. Another possible source of mechanical stress can be stress occurring during de-molding in molding processes possibly carried out later, e.g., cf. the creation of the clear encapsulation and/or of the opaque encapsulation described further below. Still another possible source of mechanical stress can be stress caused by dimensional change occurring as a consequence of a curing process such as of a curing of the clear encapsulation material and/or of the opaque encapsulation described further below.

Reducing the stress can increase manufacturing yield and reliability of the manufactured devices.

The resilient encapsulation material 7 can be an elastic material, such as an elastic polymeric material, e.g., a silicone such as PDMS (polydimethylsiloxane). Other resilient materials can be used. too.

The resilient encapsulation material 7 is translucent to light of a particular range of wavelengths emitted by or detectable by the active optical components 2.

As an option, resilient encapsulation material 7 can include spectrally influencing material, such as light absorbing particles or pigments absorbing light of wavelengths outside a particular range of wavelengths emitted by or detectable by the active optical components 2, or spectrally selectively reflective particles.

This can in instances make a produced device less sensitive to incoming light of wavelengths not to be detected in case of detecting active optical components and/or narrow down a wavelength range emitted by an emitting active optical component if the device is an emitting active optical component. Accordingly, the clear encapsulation can establish an optical filter.

The spectrally influencing material can in further instances effect a desired visual appearance of the resilient encapsulation material 7.

Application of resilient encapsulation material 7 can be accomplished by, e.g., spray coating. E.g., a single or two (possibly even more than two) spray coating layers can be subsequentially applied, wherein the material can be hardened in a final hardening step, wherein one or more intermediate hardening steps can be applied. E.g., each spray coating layer can be partially or fully hardened before application of a further layer.

Evaporation or other ways of applying the resilient encapsulation material 7 can be applied, too.

The hardening of the resilient encapsulation material 7 can be accomplished by irradiation of resilient encapsulation material 7, e.g., with ultraviolet (UV) light. An alternative or additional measure for hardening the resilient encapsulation material 7 can be to apply a heat treatment.

A layer thickness (averaged thickness) of each single spray coating layer can be, e.g., between 4 µm and 40 µm, more specifically between 8 µm and 25 µm.

A layer thickness t of the resilient encapsulation can be, e.g., between 5 µm and 50 µm, more specifically between 10 µm and 50 µm.

Independent of whether or not the optional resilient encapsulation has been applied, the manufacturing method can continue with an application of a clear encapsulation to the initial wafer 1a and to the resiliently coated wafer 1b, respectively.

For simplicity, the optional resilient encapsulation material 7 will not be drawn in the following figures, at least in most instances—even though it may be present.

The clear encapsulation can be applied by applying to the wafer (1a or 1b) a clear encapsulation material 8 which is translucent for light of a the particular range of wavelengths.

The wafer obtained will be referred to as clear encapsulation wafer 1c.

The clear encapsulation can provide protection for the active optical components 2, e.g., protection from mechanical damage and/or from contamination.

As an option, clear encapsulation material 8 can include spectrally influencing material, such as absorbing particles or pigments, absorbing light of wavelengths outside a particular range of wavelengths emitted by or detectable by the active optical components 2, or spectrally selectively reflective particles.

This can make a produced device less sensitive to incoming light of wavelengths not to be detected in case of detecting active optical components and/or narrow down a wavelength range emitted by an emitting active optical component if the device is an emitting active optical component. Accordingly, the clear encapsulation can establish an optical filter.

The spectrally influencing material can in further instances effect a desired visual appearance of the clear encapsulation material 8.

FIG. 3 depicts in a cross-sectional view a clear encapsulation wafer 1c. As depicted in FIG. 3, the clear encapsulation can optionally include passive optical components 9 which can be lens elements. The lens elements can be, e.g., refractive or diffractive or refractive-and-diffractive lens elements. The passive optical components 9 need not include lens elements, they can be, e.g., prisms or other passive optical components.

Each of the passive optical components 9 can be associated with one of the active optical components 2. This of course can include the case that each of the passive optical components 9 is associated with two (or even more) active optical components 2, and also the case that the initial wafer 1a includes, in addition to the passive optical components 9 associated with (at least) one active optical component 2, still further passive optical components (which are not associated with one of the active optical components 2).

Each of the passive optical components 9 can be aligned with respect to one of the active optical components 2, such as with respect to its associated active optical component 2.

Clear encapsulation material 8 can be a hardenable material such as a curable epoxy.

The clear encapsulation can be a unitary part and thus be a contiguous piece. It can have wafer-size.

The clear encapsulation can have an interface with substrate 3. If clear encapsulation material 7 is present, to clear encapsulation can have in addition or alternatively an interface with resilient encapsulation material 7 (cf. FIG. 2), e.g., clear encapsulation material 7 can adhere solely to resilient encapsulation material 7.

The clear encapsulation can have a surface 10 opposite substrate 3 which can be structured, e.g., by including passive optical components 9, or which can be unstructured ("flat").

Clear encapsulation material 8 can be applied in a replication process such as in a molding process, e.g., by vacuum injection molding (VIM). VIM is a known molding process in which the material to be molded is introduced into a mold by the aid of an underpressure applied to the mold.

In the replication process, the clear encapsulation material is shaped, e.g., while still being liquid or viscous, by means of a replication tool such as by a mold. Thereafter, the clear encapsulation material is hardened, e.g., cured.

The hardening can be accomplished by applying a heat treatment and/or by irradiation of the clear encapsulation material 8, e.g., with ultraviolet (UV) light.

The hardening can be accomplished from both sides, i.e., from the substrate side and from the side at which the clear epoxy is present. E.g., the hardening can include irradiation of the wafer with UV light from both sides. This can be particularly beneficial in case the clear encapsulation material is applied in a rather thick layer and/or if the clear encapsulation material covers a side face of the carrier wafer (cf. below for details).

In some instances, when devices with a very low z-height are manufactured, hardening (e.g., curing) by irradiation can effect that a warpage of the clear encapsulation wafer 1c is possibly less pronounced than if the hardening includes a heat treatment.

For an enhanced mechanical and chemical stability during subsequent processes, clear encapsulation material 8 can be fully hardened at this point, e.g., fully cured.

It is possible to provide that the hardening of the clear encapsulation material 8 is accomplished by irradiation only, i.e. without a supplemental heat treatment. This way, in some instances, an amount of warpage of the clear encapsulation wafer 1c can be kept low. Of course, the irradiation itself can induce some heat, but this is not considered a heat treatment. In some instances, in a heat treatment, temperatures of above 80° C., e.g., of above 100° C. are applied.

FIG. 4 depicts the clear encapsulation wafer 1c of FIG. 3 and a portion of a replication tool 11 operable to shape clear encapsulation wafer 1c of FIG. 3, drawn in a distance to surface 10 of the clear encapsulation such as like removed from the clear encapsulation material 8 after hardening the same.

Replication tool 11 includes a multitude of shaping sections 12, wherein each of the shaping sections 12 has a shaping surface 13 being a negative replica of a surface of one of the passive optical components 9.

The replication tool 11 can be unstructured, i.e. flat, if no passive optical components are to be produced in the clear encapsulation material 8 during the replication process. Surface 10 can be flat (unstructured) in that case.

During the replication process, substrate 3 can be supported by the carrier wafer (not illustrated).

FIG. 4A is a cross-sectional view of a carrier assembly and a replication tool (such as a mold) for producing/shaping the clear encapsulation. The tool includes one or more side parts 11b and a top part 11a which can abut one another during the molding.

The open arrow indicates that clear encapsulation material can enter a space formed between the tool and the carrier assembly. Due to the special, pyramid-like layered structure of the carrier assembly, a surface 83 of the tape 65 and a portion 82 of an upper face of carrier wafer 6 and a side face 81 of carrier wafer 6 are exposed to can be covered by the clear encapsulation material. This can result in a very stable interconnection of the clear encapsulation with the tape 65 and in particular with carrier wafer 6. The good anchoring of the clear encapsulation in the peripheral portions of the carrier assembly can make the clear encapsulation wafer relatively insensitive to various stresses such as to heat-induced stress. And potential delamination problems of the clear encapsulation can also be strongly reduced this way.

A special feature of the replication tool is that it includes the top part 11a and the one or more side parts 11b which are detachable/removable from one another. This way, top part 11a can be removed from the clear encapsulation (e.g., after the hardening) in a direction opposite to the direction along which the one or more side parts 11b can be removed from the clear encapsulation (e.g., after the hardening).

In some embodiments, the replication tool includes merely a single side part 11b (e.g., in addition to a top part). It can be, e.g., ring shaped. Side part 11b can be a unitary part (a single-piece part).

As illustrated in FIG. 4A, side part 11b can have a chamfered side shaping surface 11c. Surface 11c is chamfered to open up in a direction opposite to the direction of removal of the side part 11b. During molding, side shaping surface 11c is in contact with the clear encapsulation material.

The side shaping surface 11b can be free from surface sections facing in a direction having a component running into a vertical direction pointing from the substrate 3 to the carrier wafer 6 (in the molding position).

Applying the clear encapsulation can include, accordingly,
  arranging the side part 11b and the carrier assembly in a molding position in which the side part 11b surrounds (more specifically: laterally surrounds) the carrier assembly such that the side shaping surface is chamfered to open up in a vertical direction pointing from the carrier wafer 6 to the substrate 3; and
  shaping the clear encapsulation material by means of the side shaping surface 11b while maintaining the molding position.

After shaping the clear encapsulation material by means of the replication tool, the clear encapsulation material can be hardened (while maintaining the molding position.)

The chamfered shape of the side shaping surface 11c can reduce mechanical stress to which the carrier assembly (and in particular the clear encapsulation wafer) is exposed when the replication tool (and in particular when the side part 11b) is removed from the hardened encapsulation material.

Also for the opaque encapsulation material described in more detail below, a replication tool with corresponding properties (separable top and side part; chamfered side shaping surface) can be used.

In a subsequent step, an opaque coating is applied on the surface 10 of the clear encapsulation (cf. below for details concerning the opaque coating). And in a still further step, this opaque coating is exerted to stress which potentially can cause cracks in the opaque coating and/or delamination of the opaque coating from the clear encapsulation. A possible source of the stress can be the creation of trenches in the clear encapsulation (cf. below for details concerning the trenches), in particular wherein the opaque coating is cut through for creating the trenches.

For avoiding delamination and/or cracks in certain areas of the opaque coating, e.g., in areas where the opaque coating defines apertures (cf. below for details concerning the apertures), precautious measures can be taken.

One such measure is to provide that surface 10 of the clear encapsulation has a stepped structure. Propagation of cracks and delamination can be stopped at steps. Accordingly, steps can make possible to avoid or at least reduce the probability of emergence of cracks or delamination in certain areas. Therefore, the stepped structure establishes steps at surface 10.

Surface 10 can have depressions and/or protrusions delimited by steps.

E.g., surface 10 can have grooves.

FIG. 5A depicts in a cross-sectional view a wafer referred to as step-structured wafer 1d having a stepped structure. FIG. 5B depicts a detail of the step-structured wafer 1d of FIG. 5A in a top view.

In the example of FIGS. 5A, 5B, the stepped structure includes depressions 17 in form of grooves 19 which establish steps 18, the steps running along step lines 20. The step lines 20 (drawn as thick dotted lines in FIG. 5B) can be straight lines. The grooves 19 can define a rectangular grid.

Of course, other distributions and shapes of depressions and/or protrusions and also of grooves, if present, can be implemented.

A step height h of the steps can be between 5 µm and 50 µm, in particular between 10 µm and 30 µm. In relation to a thickness d (cf. FIG. 6B) of the above-mentioned and below-described opaque coating 23 which is later on applied on surface 10, it can apply that step height h is at least three times or at least four times thickness d. It can apply that step height h is between two times thickness d and ten times thickness d, or height h is between three times thickness d and eight times thickness d.

With reference to the above-mentioned and below-described trenches and apertures, it can be provided that between each of the apertures and any of the trenches, there is a step line present along which surface 10 is stepped. E.g., said trenches can run within the grooves 19, having a smaller width than the grooves.

The grooves 19 can have a width of between 50 μm and 1000 μm, e.g., between 150 μm and 800 μm.

The stepped structure and thus, e.g., the grooves 19, can be created by removing a portion of the clear encapsulation material 8 after the clear encapsulation material 8 has been applied and hardened. This can be accomplished, e.g., by means of a dicing saw. E.g., the depth by which blades of the dicing saw enter the clear encapsulation material 8 can be adjusted to produce a desired step height h, a width of the dicing blades can be selected to produce a desired groove width, and sawing lines along which the blades remove material from the clear encapsulation can be selected to produce steps along desired step lines. An alternative to dicing with a dicing saw can be, e.g., abrasive water jet ablation, laser ablation, or grinding.

Another way of creating the stepped structure is to create the stepped structure already when applying the clear encapsulation material 8. E.g., if the clear encapsulation material is shaped in a replication process, the corresponding replication tool can be structured to produce (in the replication process) the stepped structure. In instances, this can simplify the manufacturing process, e.g., by eliminating a step such as the before-described step of removing a part of the clear encapsulation material 8 for creating the stepped structure.

FIG. 5C depicts a replication tool 21 structured for producing a stepped structure in the clear encapsulation, along with a so-obtained step-structured wafer 1d which can have the same shape as step-structured wafer 1d of FIG. 5A. Replication tool 21 can be similar to replication tool 11 of FIG. 4 in that both are structured for producing passive optical components 9 (which merely is an option), but replication tool 21 is, unlike replication tool 11, structured for producing the stepped structure of the clear encapsulation. In particular, replication tool 21 can therefor have protrusions 22, and thus, e.g., protrusions 22 for producing grooves 19.

Replication tool 21 can be used in a molding process, e.g., in a VIM process as described above.

Another way of avoiding delamination and/or cracks in certain areas of the opaque coating, which can be an alternative or an additional measure to the above-described provision of a stepped structure in the clear encapsulation, is based on a particular way of structuring the opaque coating and will be described further below.

In a subsequent step, an opaque coating is applied to the clear encapsulation. A function of the opaque coating is to define apertures, wherein each aperture is associated with one of the active optical components and aligned accordingly.

Each aperture, i.e. each opening, can be delimited by a stop, wherein the stops are included in the opaque coating. Even though in the present patent application it is mostly referred to the apertures, it would also be possible to refer to the material structures delimiting the apertures, i.e. to the stops included in the opaque coating.

Each aperture can be provided for delimiting a light cone of light emitted from and of light to be detected by one (or more) of the active optical components, respectively. This does not exclude the case that there are further apertures which provide and additional delimiting of the same light cone(s).

It is possible that active optical components can be present which are not associated with one of the apertures, and it is also possible that two (or even more) active optical components are associated with a single aperture. There can, however, be a one-to-one relation between apertures and active optical components, i.e. each aperture is associated with no more than exactly one active optical component and, vice versa, each active optical component is associated with no more than exactly one aperture.

FIG. 6B depicts in a cross-sectional view an opaque coating wafer 1e. In the depicted example, step-structured wafer 1d of FIG. 5A including passive optical components 9 is the underlying wafer onto which an opaque coating 23 has been applied. However, it is also possible to apply the opaque coating 23 on an unstepped wafer (not including the stepped structure, e.g., as shown in FIGS. 3, 4) and/or to a wafer not including any passive optical components 9, and thus even to an unstructured wafer including neither the stepped structure nor the passive optical components 9 in the clear encapsulation.

The opaque coating 23 is opaque to light of a particular range of wavelengths emitted by or detectable by the active optical components 2.

One way to produce a structured opaque coating, e.g., like the one illustrated in FIG. 6B, is to use a photostructurable material. E.g., the photostructurable material is applied across the underlying wafer, and then selectively irradiated and thereafter developed.

For example, a resist material (such as a photoresist material) can be used, but also other photostructurable materials can be used.

FIG. 6A depicts in a cross-sectional view a state of the wafer before the opaque coating 23 is finalized, namely a state after applying an opaque coating material 24 to surface 10 of clear encapsulation material 8. In FIG. 6A, opaque coating material 24 is still unstructured. Thereafter, it is structured in order to produce a multitude of apertures 25 and thus to create opaque coating 23 as depicted in FIG. 6B.

The opaque coating material 24 can be spray-coated onto the clear encapsulation material 8. Other ways of applying opaque coating material 24 can be used, e.g., spin coating.

The opaque coating material 24 can be structured, e.g., by selective illumination by means of, e.g., laser direct imaging (LDI) or using a mask.

Developing the selectively illuminated opaque coating material 24 can be accomplished, e.g., by spinning, i.e. by rotating the wafer while applying a suitable developer (e.g., a liquid developer) onto the applied opaque coating material 24. Other ways of developing the selectively illuminated opaque coating material 24 are possible, too.

If passive optical components 9 are present in the clear encapsulation material 8, as is illustrated, e.g., in FIGS. 6A, 6B, each of the passive optical components 9 can be associated with one of the apertures 25. E.g., each passive optical component 9 can be centered with respect to its associate aperture 25.

For producing well-defined and well-aligned apertures 25, it can be of advantage to define the apertures 25 in a particularly thin opaque coating material 24.

Photolithograhic structuring can be accomplished with high precision which can be beneficial for producing well-defined and/or small apertures.

The thickness d of the opaque coating 23 can be, e.g., between 0.5 μm and 10 μm and more particularly between 1 μm and 8 μm, e.g., between 2 μm and 6 μm.

As has been announced above, another way of avoiding delamination and/or cracks in certain areas of the opaque coating, will be described in the following. This can be an alternative to the above-described provision of a stepped structure in the clear encapsulation or be a measure applied in addition thereto.

It is possible to apply a particular way of structuring the opaque coating 23, namely, e.g., in such a way that regions are produced which are free of the opaque coating 24 and which (fully or partially) surround the areas to be "protected" such as the areas where the apertures 25 are defined by the opaque coating 23.

FIG. 6C depicts in a cross-sectional view an opaque coating wafer 1e having a suitably structured opaque coating 23. FIG. 6D depicts a detail of the opaque coating wafer 1e of FIG. 6C in a top view.

The opaque coating 23 of FIGS. 6C, 6D is similar to the one of FIG. 6B, but it includes regions 26 which are free of the opaque coating material 24—in addition to the apertures 25.

Regions 26 can be produced during structuring the applied opaque coating material 24, e.g., by suitably illuminating (and developing) the applied opaque coating material 24.

In FIG. 6D, also trenches 27 are depicted by means of which side walls of intermediate products are created, as will be described below (cf. FIG. 7). As illustrated in FIG. 6D, the trenches 27 can run inside the regions 26. Thus, in the example of FIG. 6D, the trenches 27 do not run through the opaque coating 23. This can be the case, but does not necessarily have to be the case.

And regions 26 can be located within depressions 17 and grooves 19, respectively, as illustrated in FIG. 6C.

It can be provided, that each of the apertures 25 is separated from any of the trenches 27 (to be produced, cf. below) by at least one region 26 which is free of the opaque coating material 24. This provided, trenches 27 can run, at least in part, through opaque coating material 24 of opaque coating 23.

For various applications, it can be of advantage to keep as much undesired stray light out of the produced optical device as possible and/or to keep light as completely as possible from exiting the device along undesired paths.

This is one possible reason for the following subsequent manufacturing steps in which side walls are produced by producing trenches extending through the clear encapsulation and covering the side walls by an opaque encapsulation material.

Another possible reason for those subsequent manufacturing steps is that reliability and/or mechanical stability of the finished product possibly can thereby be enhanced.

For simplicity, the further steps will, at least in part, be illustrated with opaque coating wafer 1e of FIG. 6B as underlying wafer. However, the steps can also be accomplished based on other wafers.

In a first subsequent step, a trenched wafer 1f is produced like the one depicted in a cross-sectional view in FIG. 7. Trenched wafer 1f is produced by creating trenches 27 which extend fully through the clear encapsulation. The trenches 27 can, as illustrated in FIG. 7, extend partially into substrate 3.

In order to preserve cohesion of the trenched wafer 1f and preserve a precise relative positioning of the separate portions of clear encapsulation material 8, it can be provided that the trenches 27 do not extend fully through substrate 3.

Having the trenches 27 extending partially into substrate 3 can help to achieve a good light-tightness in the respective locations near substrate 3, as will become clear further below.

Trenches 27 can extend into substrate 3 by between 0 µm and 50 µm, more particularly between 2 µm and 30 µm, e.g., between 5 µm and 25 µm. Side walls 30 can be vertically aligned walls.

Trenches 27 can extend into substrate 3 by between 5% and 75%, more particularly between 10% and 50%, e.g., between 15% and 35% of the thickness of the substrate 3.

Trenches 27 can be produced by, e.g., sawing, e.g., using a dicing saw. Care has to be taken when adjusting the depth to which blades of the dicing saw remove material.

Producing the trenches 27 creates side walls 30 in the clear encapsulation. Side walls 30 can be vertically aligned walls. Producing the side walls 30 can also be understood as producing a multitude of intermediate products 28. Therein, each intermediate product can include a portion of the clear encapsulation, one (or more) of the active optical components 2 and the respective associated aperture 25. The latter does not exclude that there are some of the intermediate products 28 which do not include an aperture and neither that there are intermediate products which include two (or more) apertures.

Each intermediate product can also include at least one, in particular at least three, e.g., four of the side walls 30.

Producing the side walls 30 can more specifically also be understood as producing a wafer-level arrangement 29 of intermediate products 28.

A wafer-level arrangement of items means that there is a multitude of items which have fixed relative positions (across the wafer such as across trenched wafer 1f). E.g., keeping the items (the intermediate products 28) in place to have constant relative positions (at least laterally) can be accomplished by substrate 3—at least if substrate 3 is not divided into separate parts, e.g., by producing trenches 27.

A finally produced device can include one or more intermediate products 28. E.g., in case of a single-channel device, it can include, e.g., no more than a single intermediate product 28. And, e.g., in case of a dual-channel device, it can include, e.g., no more than exactly two intermediate products 28, e.g., which can be neighboring intermediate products 28 in the wafer-level arrangement 29.

As has been described above, producing trenches 27 can induce cracks or delamination in opaque coating 23. Various measures that can be taken to avoid that the apertures 25 deteriorate because of such cracks or delaminations have been described above.

Exemplary possible positions of trenches have been depicted in FIG. 6D.

Trenches 27 can define a rectangular grid.

As is clear from the examples, it can be provided that each trench 27 lies (with respect to its lateral position and extension) within one of the depressions 17, e.g., within one of the grooves 19.

As is clear from the examples (cf. FIG. 6D), it can be provided that each trench 27 lies (with respect to its lateral position and extension) within one of the regions 26.

Of course, plenty variations are possible here.

A width of the trenches 27 can be, e.g., between 50 µm and 1000 µm, more particularly between 100 µm and 600 µm.

In a further subsequent step, trenches 27 are filled by an opaque encapsulation material.

FIG. 8 depicts in a cross-sectional view a detail of an opaque encapsulation wafer 1g which can be obtained by applying to a trenched wafer 1f, such as to trenched wafer 1f of FIG. 7, an opaque encapsulation material 31. The trenches 27 created before (cf. FIG. 7) can be filled by the application of the opaque encapsulation material 31.

FIG. 8 illustrates that opaque encapsulation material 31 can be applied to the wafer-level arrangement 29 of intermediate products 28 depicted in FIG. 7.

This way, the side walls 30 of the intermediated products 28 are covered by opaque encapsulation material 31.

Each intermediate product 28 can be laterally surrounded by opaque encapsulation material 31.

Each active optical component 2 can be laterally surrounded by opaque encapsulation material 31.

Space present between mutually opposing side walls of neighboring intermediate products 28 can be filled, in particular completely filled, with opaque encapsulation material 31.

The opaque encapsulation material 31 is opaque to light of a particular range of wavelengths emitted by or detectable by the active optical components 2.

After applying the opaque encapsulation material 31, it is hardened, e.g., cured. Thereby, it can become rigid.

Opaque encapsulation material 31 can be a polymer-based material which can be hardened, e.g., cured, wherein the hardening can be accomplished by, e.g., applying energy to the material, e.g., in form of heat and/or in form of radiation. For example, opaque encapsulation material 31 can include an epoxy resin such as a curable epoxy.

The hardening, e.g., curing process can be accomplished so as to achieve that the opaque encapsulation material 31 thereby is completely hardened and fully cured, respectively, at this point The hardening process can include a heat treatment, e.g., an application of a temperature of at least 100° C., e.g., of at least 110° C., such as between 110° C. and 140° C. for a duration of, e.g., at least 10 min, such as between 10 min and 60 min.

It can be provided that no heat treatment is applied in the described manufacturing process (starting with the initial wafer 1a) before the hardening process of the opaque encapsulation material 31. This can make possible to reduce warpage of the wafer before application of the opaque encapsulation material 31.

In addition to the heat treatment, irradiation, e.g., with UV radiation, can be applied. This can accelerate the hardening process.

The so-obtained opaque encapsulation 32 can contribute to light-tightness of the final product (in places where desired) and can also enhance mechanical stability of the final product, as will become clearer further below.

The application of opaque encapsulation material 31 can be accomplished in such a way that the apertures 25 remain free of opaque encapsulation material 31.

The opaque encapsulation material 31 can be applied in such a way that the opaque encapsulation 32 together with the opaque coating 23 or together with parts of the opaque coating 23 constitute a contiguous part.

The opaque encapsulation 32 and the opaque coating 23 together can form a contiguous opaque shell for each intermediate product 28, wherein each of the shells contains (on its inside) the respective portion of the clear encapsulation material 8, and each of the shells defines (via the opaque coating 23) a respective aperture 25.

Opaque encapsulation 32 and opaque coating 23 can be mutually abutting and/or overlapping. They can be mutually abutting and/or overlapping for avoiding the presence of slits between opaque encapsulation 32 and opaque coating 23 through which light of said particular range of wavelengths could pass.

Having an overlap between opaque encapsulation 32 and opaque coating 23 can contribute to a safer manufacturing process in terms of avoiding said slits.

Without overlap, the application of the opaque encapsulation material 31 must be very well controlled in order to prevent formation of slits, e.g., from air inclusions or voids where opaque encapsulation 32 and opaque coating 23 should be abutting.

One way of applying opaque encapsulation material 31 is to do it in a replication process such as in a molding process. E.g., opaque encapsulation material 31 can be applied by vacuum injection molding (VIM).

In FIG. 8, opaque encapsulation wafer 1g is depicted along with a replication tool 33 operable to shape opaque encapsulation material 31.

Like explained above for the shaping by replication of the clear encapsulation, also the opaque encapsulation can be shaped by means of a replication tool including one or more side parts having a chamfered side shaping surface (cf. item 1c in FIG. 4A). Likewise, this can provide an improved anchoring of the opaque encapsulation to the clear encapsulation. This can reduce the exposure of the wafer to mechanical stress. FIG. 9A (cf. below) illustrates an example of a resulting opaque encapsulation.

And, the hardening of the opaque encapsulation material can be accomplished from both sides, i.e., from the substrate side and from the side at which the clear epoxy is present. E.g., the hardening can include irradiation of the wafer with UV light from both sides and/or include application of heat from both sides. This can be particularly beneficial in case the opaque encapsulation material is applied in a rather thick layer and/or if the opaque encapsulation material covers a side face of the carrier wafer and/or a face of the clear encapsulation covering a side face of the carrier wafer.

Replication tool 33 can include at least one resilient inner wall 34. The opaque encapsulation material 31 can be shaped by the resilient inner wall 34 or, more particularly, by a replication surface 36 constituted by a surface 35 of the resilient inner wall 34. In that case, replication tool 33 can also be referred to as a resilient replication tool 33. In addition, replication tool 33 can include a rigid back 37 as a mechanical support for resilient inner wall 34.

During shaping the opaque encapsulation material 31, the replication surface 36 can be contact with the opaque coating material 31 in order to shape it.

Resilient inner wall 34 can be made of an elastic polymeric material, e.g., of a silicone, e.g., of PDMS. In instances, the provision of a resilient inner wall 34 can enhance yield and/or manufacturability, in particular for very thin trenched wafers 1f.

During the replication process, substrate 3 can be supported by the carrier wafer, cf. above for details (not illustrated in FIG. 8).

The resilience of resilient inner wall 34 can, to some extent, adapt to warpage of trenched wafer 1f and of opaque encapsulation wafer 1g which can contribute to minimizing crack formation and delamination.

CTE mismatch problems occurring as a consequence of a heat treatment for hardening the opaque encapsulation material 31 and other sources of mechanical stress to which the wafer (trenched wafer 1f or opaque encapsulation wafer 1g) is exposed can be mitigated by the resilience of resilient inner wall 34.

If wafer-level arrangement 29 of intermediate products 28 is suitably designed, as is the case in the example depicted in FIG. 8, replication tool 33 can be unstructured, i.e. flat. Surface 35 can be flat in that case.

Alternatively, it can be provided that replication tool 33 includes a multitude of shaping sections, wherein each of the shaping sections has a structured surface.

A possible function of replication tool 33 is to avoid an entry of opaque encapsulation material 31 into any of the apertures 25 and, if present, onto any of the passive optical components 9.

The resilience of resilient inner wall 34 can support this function.

As symbolized in FIG. 8 by the open arrow, surface 35 of replication tool 33 (more specifically: of resilient inner wall 34) is pressed against trenched wafer 1f during application of opaque encapsulation material 31, and more specifically, surface 35 is in direct contact with a sections 42 of opaque coating 23.

The pressure applied can be due to an underpressure applied for the VIM process. Alternatively or in addition, further pressure can be applied (externally). This way, sections 42 of opaque coating 23 and sections 43 of surface 35 of replication tool 33 can, together, form a seal 41, wherein the seal 41 cannot be crossed by opaque encapsulation material 31 during its application to trenched wafer 1f.

The seal 41 can prevent opaque encapsulation material 31 from spreading through the seal 41 from one side of the seal 41 to the other side of the seal 41.

During the pressing, a multitude of hollows 44 can be established, and a multitude of the seals 41 can be established, wherein each of the seals 41 completely (laterally) surrounds one of the hollows 44.

The seals 41 can prevent that any of the opaque encapsulation material 31 enters the respective surrounded hollow 44, wherein each of the hollows 44 can enclose one of the apertures 25. If passive optical components 9 are provided, they can be enclosed by the hollow, too. And each of the seals 41 can be formed by a respective section 42 of the opaque coating 23 abutting a respective section 43 of the surface 35 of replication surface 33. Around each of the hollows 44, a seal 41 can be formed by a section of the opaque coating 23 abutting a section of the surface 35 of the replication tool 33.

Each of the hollows 44 can be confined by
a portion 45 of the surface 10 of the clear encapsulation material 8, wherein this portion can (but does not have to) include a surface portion of a passive optical component 9, e.g., a lens surface;
a portion 46 of the opaque coating 23; and
a portion 47 of the surface 35 of replication tool 33.

It can be provided that the hollows are confined by no more than these three items.

Each of the hollows 44 can be hermetically closed with respect to penetration of the opaque encapsulation material 31 during the application of the opaque encapsulation material 31.

As shown in, e.g., FIGS. 7, 8, it can be provided that for each passive optical component 9, a point of the respective passive optical component 9 most distant from substrate 3 is closer to substrate 3 than a point of the clear encapsulation material 8 which is most distant from substrate 3, or at least than a point of the opaque coating 23 which is most distant from substrate 3.

Similarly, it can be provided that no part of the passive optical components 9 extends (in a direction pointing from substrate 3 to opaque coating 23) beyond opaque coating 23.

In these cases, for example, an unstructured replication tool 33 (with a flat surface 35) can be used, making possible that precision alignment steps for laterally adjusting replication tool 33 with respect to trenched wafer 1f can be dispensed with.

However, if parts of passive optical components (or even other parts of clear encapsulation material 8) extend beyond opaque coating material 24, hollows and seals can be formed during application of opaque encapsulation material 31 (for keeping apertures 25 and passive optical components 9 free from the opaque encapsulation material 31) by using a suitably structured replication tool. E.g., such a replication tool can be structured to include openings to be laterally aligned with respect to the apertures (in a distance to substrate 3 greater than a distance to substrate 3 of the apertures 25), so as to accommodate said parts of the passive optical components 9.

In view of heat treatments to follow afterwards and consequential dimensional problems (e.g., CTE mismatch problems) potentially resulting in warpage, delamination, cracking, but also in order to relax stresses already present in the opaque encapsulation wafer 1g, e.g., due to a heating treatment for hardening the opaque encapsulation material 31, the following measures relating to cuts in the opaque encapsulation can be taken.

For one or more of the reasons above, cuts 48 can be produced in opaque encapsulation material 31. Those cuts 48 do not segment substrate 3 or opaque encapsulation 32 (and neither the wafer-level arrangement 29 of intermediate products 28).

FIG. 9 depicts in a cross-sectional view a detail of a wafer 1h with cuts 48 which can be obtained, e.g., from opaque encapsulation wafer 1g of FIG. 8. The cuts 48 can be produced, e.g., by laser cutting or using a dicing saw.

When applying the opaque encapsulation 32 using a replication tool such as a mold, cf., e.g., FIG. 8 item 33, the opaque encapsulation wafer 1g can remain attached to the replication tool, so that the opaque encapsulation wafer 1g is mechanically supported, and its constituents keep their relative positions during application of opaque encapsulation 32. Applying a vacuum and/or mechanical clamping, for example, can be applied for ensuring that the opaque encapsulation wafer 1g remains attached to the replication tool.

Before producing cuts 48, replication tool 33 is removed in order to give access to the upper face of opaque encapsulation wafer 1g (which is opposite substrate 3) for producing the cuts 48. During this, mechanical support continues being provided by the rigid carrier wafer (not illustrated in FIG. 9).

The cuts 48 can run along the trenches 27 in the clear encapsulation material 8, and they can run inside the trenches 27.

They can define a rectangular grid.

The cuts 48 can run along cut lines which are aligned with respect to the trenches 27, e.g., centered with respect to the trenches 27.

The cuts 48 can be very narrow. A width of the cuts 48 can be, e.g., between 1 µm and 500 µm, more particularly between 5 µm and 300 µm.

When the cuts 48 run along the trenches 27, they can have a (lateral) width of less than the width of the trenches 27. E.g., they can have a width of at most, e.g., 0.8 times a width of the respective trench 27 (where the cut is located) or, e.g., of at most 0.5 times said width of said respective trench 27.

A penetration depth of the cuts 48 into the opaque encapsulation material 31 can be, e.g., between 5 µm and 1000 µm, in instances between 50 µm and 300 µm. This can depend on, e.g., material properties and on temperatures applied during the processing.

It can be provided that the cuts 48 do not extend into the clear encapsulation material 8, i.e. that clear encapsulation material 8 can remain uncut while applying the cuts.

After producing cuts 48, the opaque encapsulation 32 still fully covers all the side walls 30 of the intermediate products.

The cuts 48 can be produced before a singulation step in which singulated optical module are produced. Cf. below for a singulation step, e.g., FIG. 10. And the cuts 48 can be produced before a further heat treatment is applied, wherein said further heat treatment is applied before the singulation step.

Another option can be to produce one or more furrows extending (fully) through the opaque encapsulation wafer 1g and (fully) through the wafer 1h with cuts, respectively. Such a furrow 70 is illustrated in a cross-sectional view in FIG. 9A. The furrow 70 extends (fully) through the opaque encapsulation material 31, (fully) through the clear encapsulation material 8 and (fully) through the substrate 3. Furrow 70 can partially extend into or even extend (fully) through the wafer 1g and 1h, respectively.

The one or more furrows 70 can laterally surround, e.g., fully surround, an area in which all intermediate products are arranged. This is illustrated in a top view in FIG. 9B. Thus, all optical modules to be singulated (illustrated as small squares in FIG. 9B) can be located laterally inside a line described by the one or more furrows 70.

The one or more furrows 70 can contribute to minimizing stress to which the wafer is exposed when it is removed from the tape 65 (and from carrier wafer 6), e.g., before singulation. The furrows 70 can provide some guidance to the wafer (or wafer part) during its removal from the tape 65 (in a direction parallel to a vertical direction). And it can be (at least partially) prevented that deformations originating in peripheral portions 63 detrimentally influence the inner portion of the wafer and thus also the optical modules to be singulated.

The one or more furrows 70 can extend into the substrate 3, e.g., through substrate 3.

The one or more furrows 70 can extend into the tape 65, e.g., through tape 65.

Accordingly, as a step subsequent to producing cuts 48 in the opaque encapsulation (and, if present, the furrows 70) described above, another heat treatment can optionally be applied, such as for the purpose of strengthening an adhesion of the opaque coating 23 to the clear encapsulation material 8. A too small adhesion of the opaque coating 23 to the clear encapsulation material 8 can result in delamination of the opaque coating 23 from the clear encapsulation material 8 during a subsequent singulation step in which singulated optical module are produced.

With the above-described cuts provided, a warpage of the wafer 1h before the heat treatment is quite low (low enough to ensure no or only little delamination) and can remain quite low (low enough to ensure no or only little delamination) during the heat treatment and during cooling down after the heat treatment.

The sequence (order) of
  applying a heat treatment for hardening the opaque encapsulation material 31, then
  producing the cuts (and optionally also the furrows 70), and then
  the heat treatment for enhancing an adherence of the opaque coating 23 to the clear encapsulation material 8
(all this before the singulation described below) can make possible to produce products with no or only little delamination, to achieve a high production yield, and to produce products of high reliability.

During the heat treatment for strengthening the adhesion of the opaque coating 23 to the clear encapsulation material 8, a temperature of above 100° C. such as a temperature of between 110° C. and 160° C., e.g., between 115° C. and 150° C. can be applied.

It can be provided that the temperature applied is at least as high as the temperature applied for hardening the opaque encapsulation material 31.

The heat can be applied for a duration of between 5 min and 120 min, e.g., for between 10 min and 60 min.

The heat can be applied, e.g., for at least 10 min.

The heat can be applied, e.g., for at most 50 min.

It can be provided that no heat treatment is applied in the described manufacturing process after the hardening process of the opaque encapsulation material 31 and before the heat treatment for the strengthening the adhesion of the opaque coating 23 to the clear encapsulation material 8.

And it can, e.g., at the same time be provided that no heat treatment is applied in the described manufacturing process (starting with the initial wafer 1a) before the hardening process of the opaque encapsulation material 31.

In the already announced singulation step, the wafer (opaque encapsulation wafer 1g, or wafer 1h with cuts 48 and optionally with furrows 70, with our without having been subjected to the the heat treatment for the strengthening the adhesion of the opaque coating 23 to the clear encapsulation material 8) is singulated to produce singulated optical modules.

In particular, a wafer-level arrangement of singulated optical modules can be obtained this way.

In FIG. 9, places where the wafer (in the illustrated case wafer 1h with cuts 48) is segmented (for the singulation), are illustrated by thick dotted lines. As indicated in this example, each singulated optical module 50 produced this way can include, e.g., two channels, each channel including one active optical component 2 and (optionally) one passive optical component 9. Single-channel optical modules or still other modules can of course be produced in a corresponding way.

In the singulation step, substrate 3 can transform into substrate parts 49a. Singulation can be accomplished by means of dicing, e.g., using a dicing saw. Other ways of accomplishing the singulating can be applied, e.g., laser cutting.

During singulation, a temporary layer, such as, e.g., an adhesive tape, can be applied to the wafer, e.g., to the wafer's face opposite substrate 3. Accordingly, the temporary layer can adhere to at least part of the opaque coating 23. Singulation can then take place from the substrate-side of the wafer, such that stresses to which opaque coating 23 is exposed during singulation, e.g., mechanical stresses from dicing with a dicing saw, are low.

The temporary layer can be a tape and more particularly an adhesive tape such as, e.g., a UV tape which strongly reduces its adhering property when exposed to UV light.

If, as proposed in an option, the substrate 3 is attached to carrier wafer 6 during most manufacturing steps, e.g., via tape 65, substrate 3 (or rather wafer 1g and 1h, respectively) will be removed therefrom before singulation in order to enable a transfer from carrier wafer 65 (or, e.g., from tape 65) to temporary layer 68. This is symbolized in cross-sectional FIGS. 13A and 13B. In FIG. 13A is illustrated that carrier assembly 66 including wafer 1g (which is illustrated in a strongly simplified fashion, and which also could be, in another embodiment, wafer 1h) is attached to temporary layer 68. During this, temporary layer 68 can be attached to a wafer frame 69 which can be ring-shaped. Then, tape 65 (and therewith carrier 6) is removed from wafer 1g, e.g., by strongly reducing the adhering property of tape 65 by heat.

FIG. 13B illustrates the situation after removal of carrier wafer 6 and after singulation. Accordingly, a wafer-level arrangement 55 of singulated optical modules 50 is attached to temporary layer 68. The small arrows indicate places where separation is accomplished. Substrate parts 49 (not specifically indicated in FIGS. 13A, 13B) are facing away from temporary layer 68.

After singulation, the temporary layer 68 can be removed from the wafer, e.g., including irradiation with UV light.

Before a removal of the temporary layer 68 from arrangement 55, an auxiliary layer 53 (cf. FIG. 10), such as an adhesive tape, can be applied to the opposite side of the wafer, i.e. to substrate parts 49a.

This way, relative positions of the singulated optical modules (and thus the wafer-level arrangement of singulated optical modules) can be preserved despite removal of the temporary layer 68.

In some cases, it can be desirable that the final product includes a spectral filter.

E.g., the spectral filter can be present at least in all the apertures 25. This way, light emitted by and detected by the active optical components 2, respectively, can be filtered by the spectral filter layer when passing through the respective aperture 25.

It is possible to apply a spectral filter layer to the wafer already prior to singulation. In that case, the application of the spectral filter layer can be accomplished after applying the heat treatment for the strengthening the adhesion of the opaque coating 23 to the clear encapsulation material 8 or, alternatively, before such a heat treatment—if such a heat treatment is applied.

However, it is also possible to apply a spectral filter layer after singulation.

FIG. 10 depicts in a cross-sectional view a detail of a wafer-level arrangement 55 of singulated optical modules 50 on which a spectral filter layer 52 is present. Portions of spectral filter layer 52 which can possibly be present at or between side walls 30 are not drawn in FIG. 10.

In the wafer-level arrangement 55 of singulated optical modules 50, gaps 56 between neighboring singulated optical modules 50 are present. They can be due to the singulation process. Each of the singulated optical modules 50 can have an opaque wall structure 54 which can include vertically oriented walls (which can form opaque side walls of the singulated optical modules 50), which can be made of portions 51 of opaque encapsulation material 31 and/or which can delimit the gaps 56. Side walls 30 of the intermediate products 28 can be covered by the portions 51 of the opaque encapsulation material 31.

Application of spectral filter layer 52 can be accomplished, e.g., by spray coating, or by spinning, or in other ways. In particular when applying spectral filter layer 52 after singulation, spray coating can possibly be more suitable than spinning.

It is possible to apply spectral filter layer 52 selectively to the apertures 25.

Spectral filter layer 52 can let pass light in one or more specific wavelength ranges while blocking, e.g., absorbing, light in other wavelength ranges. E.g., it can be provided that spectral filter layer 52 is translucent for light of a particular range of wavelengths emitted by or detectable by the active optical components 2.

For example, spectral filter layer 52 can be an IR filter, and passive optical components 2 are operable to emit IR light and/or are operable to detect IR light.

A thickness of spectral filter layer 52 can be, e.g., between 0.5 μm and 50 μm, such as between 1 μm and 20 μm, e.g., between 1 μm and 10 μm.

After application of spectral filter layer 52 onto the wafer or onto the wafer-level arrangement 55 of singulated optical modules 50, spectral filter layer can be hardened, e.g., cured. The hardening can be accomplished by, e.g., irradiation of spectral filter layer 52, e.g., with UV radiation. Alternatively or in addition, a heat treatment or a drying step can be applied for accomplishing the hardening.

In connection with steps described above, one can, as an example and with reference to FIG. 10, produce a wafer-level arrangement 55 of singulated optical modules 52, wherein it is ensured by, e.g., an auxiliary layer 53 applied to the substrate-sides of the optical modules 50 that the singulated optical modules 50 remain in fixed relative positions during producing the singulated optical modules. Then, spectral filter layer 52 is applied to the wafer-level arrangement 55 of singulated optical modules 50, e.g., by spray coating. And then, spectral filter layer 52 is hardened, e.g., cured, e.g., by UV irradiation.

Applying and hardening spectral filter layer 52 after singulation (instead of before singulation) can reduce delamination problems and/or crack formation.

After singulation, i.e. after producing singulated optical modules 50, e.g., in form of a wafer-level arrangement 55 of singulated optical modules 50, another heat treatment can be applied, which can be a final heat treatment of the manufacturing process. If a spectral filter layer 52 (cf. FIG. 10) is applied, this heat treatment can be applied after application of the spectral filter layer 52.

By means of this heat treatment, the singulated optical modules 50 can be thermally stabilized. Adherence between different materials can be improved and/or mechanical stresses can be reduced and/or equilibrated between the different materials.

A temperature to which the singulated optical modules 50 are heated during this thermal treatment can be between 100° C. and 160° C., e.g., between 115° C. and 150° C.

The temperature applied can be, e.g., at least as high as the temperature applied for hardening the opaque encapsulation material 31.

The temperature applied can be, e.g., within 10° C. identical to the temperature applied in the heat treatment for strengthening the adhesion of the opaque coating 23 to the clear encapsulation material 8.

The heat can be applied for a duration of between 30 min and 240 min, e.g., for between 60 min and 180 min.

The heat can be applied, e.g., for between 2 times and 15 times, such as 3 times and 10 times the time during which the heat for strengthening the adhesion of the opaque coating 23 to the clear encapsulation material 8 is applied.

An automated optical inspection (AOI) can be accomplished, e.g., after the last one of the above manufacturing steps which is carried out. E.g., AOI can be applied to a wafer-level arrangement 55 of singulated optical modules 50 (with or without spectral filter layer 52 applied).

Several steps and/or sequences of steps are particularly designed for the manufacture of very thin wafers, and in the case that the wafers are prevailingly made of polymer-based materials, e.g., more than 50% or even more than 70% of the wafer volume can be polymer-based materials. Under such circumstances, special care must be and has been taken of the material properties such as of the CTEs of the polymer-based materials (which in instances are relatively high when compared to CTEs of metals or semiconductor materials typically used) and of their humidity uptake and their consequential expansion (which can also be relatively high). Also shrinkage of materials during hardening, in particular during curing, must be and has been considered, at least in instances.

For example, instead of trying to force the wafer to be completely flat during all processing steps, it is suggested that the wafer is allowed, to some extent, to show warpage, which is enabled by using resilient materials such as by resilient molds and/or attached resilient layers.

And, as another example, heat treatments are, where possible, postponed towards the end of the manufacturing process (possibly to after singulation) and/or are separated into separate heat treatments, while between the separate heat treatments, mechanical stress is reduced, e.g., by segmenting the substrate and/or by singulation.

Furthermore, manufactured devices can be devoid any hollows and gas inclusions.

FIG. 11 is a flow chart of an example of the before-described method, wherein not all options are explicitly illustrated in FIG. 11.

Optional step 100 can relate to, e.g., mounting the active optical components on the substrate. Step 101 concerns the provision of the initial wafer. Optional step 105 can relate to, e.g., the provision of the resilient encapsulation. Step 105 can additionally or alternatively relate to attaching the initial wafer to the carrier wafer and/or to a transfer of the initial wafer from the initial tape to the carrier wafer, e.g., by means of the special vacuum chuck described herein before. In step 110, the clear encapsulation is applied. Optional step 115 can relate to, e.g., the creating of the stepped structure. Step 120 concerns the application of the opaque coating material onto the clear encapsulation. In step 130, the structuring of the opaque coating material to produce the opaque coating including the apertures. Step 140 concerns the creation of the trenches extending through clear encapsulation material and the establishing of the side walls, so as to produce the wafer-level arrangement of intermediate products, wherein each intermediate product has side walls. Step 150 concerns the application of the opaque encapsulation to the intermediate products including filling the trenches with the opaque encapsulation material. Optional step 155 can relate to, e.g., the provision of the furrows in the opaque encapsulation and/or to the heat treatment for, e.g., the purpose of strengthening an adhesion of the opaque coating to the clear encapsulation material. Step 160 concerns cutting through the opaque encapsulation material present in the trenches to produce the singulated optical modules, wherein each singulated product includes an intermediate product, and wherein the side walls of each intermediate product is covered by the opaque encapsulation material. Optional step 165 can relate to, e.g., the application of the spectral filter and/or to the heat treatment which can be the final treatment of the method and/or the AOI step.

The optical devices that can be manufactured by the described manufacturing method can include the described singulated optical modules 50. They can, e.g., be identical therewith.

In the following, some exemplary optical devices will be described, wherein they correspond to singulated optical modules. However, it will be appreciated that many further kinds of optical devices can be manufactured according to the described method, depending on which steps are carried out and which steps are omitted, respectively.

FIG. 12A depicts in a cross-sectional view a single-channel optical device 60 which includes no passive optical component and without step structure of the clear encapsulation and wherein opaque coating 23 and opaque encapsulation 32 are merely abutting.

The optical device 60 includes a substrate part 49a, an active optical component 2, an opaque wall structure 54 (made of opaque encapsulation material 31, cf., e.g., FIGS. 8-10) and an opaque coating 23 (made of opaque coating material 24) which defines an aperture 25. It furthermore includes clear encapsulation material 8 which is surrounded by opaque wall structure 54 (sideways), opaque coating 23 (on top) and substrate part 49a (below). In the illustrated example, active optical component 2 is mounted on substrate part 49a and electrically connected thereto by, e.g., a wirebond 4. Active optical component 2 is encapsulated by clear encapsulation material 8. This can also be considered an overmolding of active optical component 2 by clear encapsulation material 8. Under the assumption that also substrate part 49a is opaque (as always herein, in the sense that it is opaque for light of a particular range of wavelengths emitted by or detectable by the active optical component 2), clear encapsulation material 8 is completely opaquely covered (by opaque wall structure 54, opaque coating 23 and substrate part 49a) with the aperture 25 as only exception. Clear encapsulation material 8 and active optical component 2 can be light-tightly enclosed in the described way—and thus with the exception of aperture 25.

When describing the section of the initial wafer finally included in an optical device, instead of referring to the substrate part 49a and the at least one active optical component 2 (wherein the at least one active optical component 2 can optionally be included in the substrate part 49a), it is also possible to state that the section of the initial wafer includes a substrate member 61 and, in addition, the at least one active optical component 2. In this terminology, the substrate member 61 can be identical with the substrate part 49a, if the substrate part 49a does not include the at least one active optical component 2, and it can be identical with the substrate part 49a without the at least one active optical component 2, if the substrate part 49a includes the at least one active optical component 2.

The substrate member 61 can include two opposing and mutually parallel member surfaces (which lie in lateral planes). A surface area of these member surfaces can be larger than a surface area of any other surface of the substrate member 61.

The substrate member 61 can include a multitude of openings. This can be the case, e.g., when the at least one active optical component 2 is included in the substrate part 49a. Cf. e.g., FIG. 12D and, correspondingly, FIGS. 1B and 1D.

The openings can, e.g., extend from the one to the other member surface.

In an alternative, the substrate member 61 can be devoid any openings. This can be the case, e.g., when the at least one active optical component 2 is not included in the substrate part 49a. Cf. e.g., FIGS. 12A-C and 12E-G and, correspondingly, FIGS. 1A and 1C.

In the optical device 60 of FIG. 12A, substrate part 49a has, where it abuts opaque wall structure 54 (or more precisely: in a laterally defined region where it abuts opaque wall structure 54), a thickness D2 which is reduced with respect to its thickness D1 laterally between opaque wall structure 54; e.g., an average thickness of substrate part 49a where it abuts opaque wall structure 54 can be smaller than an average thickness it has laterally between opposing walls of opaque wall structure 54. This can be due to producing trenches 27 (cf. FIG. 7) which not only extend fully through the clear encapsulation material 8, but also (and only partially) into substrate 3 and thus into substrate part 49a. This feature can be present in any of the optical devices, also in cases where not depicted in the following respective figure (such as in FIGS. 12E to 12G).

FIG. 12B depicts in a cross-sectional view an optical device 60 which corresponds to the one of FIG. 12A, but it differs therefrom in that active optical component 2 is resiliently encapsulated by a resilient encapsulation material 7 (compare also FIG. 2). This feature can be present in any of the optical devices, also in cases where not depicted in the following respective figure.

FIG. 12C depicts in a cross-sectional view an optical device 60 which corresponds to the one of FIG. 12A, but it differs therefrom in that a passive optical component 9 is established by the clear encapsulation material 8. This feature can be present in any of the optical devices, also in cases where not depicted in the following respective figure.

Passive optical component 9 and aperture 25 can be laterally overlapping. They can be, e.g., laterally centered with respect to one another.

FIG. 12D depicts in a cross-sectional view an optical device 60 which corresponds to the one of FIG. 12C, but active optical component 2 is included in a substrate part 49a originating from a substrate 3 which includes an artificial wafer, cf. FIG. 1B. Substrate part 49a can in this case include active optical component 2 and a part 5a of an interconnection frame 5 of the artificial wafer, cf. FIG. 1B.

This feature can be present in any of the optical devices, also in cases where not depicted in the following respective figure.

Of course, optical devices can also be produced based on other initial wafers and correspondingly different substrates 3, cf., e.g., FIGS. 1C and 1D besides FIGS. 1A and 1B.

FIG. 12E depicts in a cross-sectional view an optical device 60 which corresponds to the one of FIG. 12A, but it differs therefrom in that the clear encapsulation is stepped, as indicated at 18 designating a step. Opaque coating material 24 is not flat, like in FIG. 12A, but is stepped, too, as indicated at 18 designating a step in the opaque coating 23.

In FIG. 12E, opaque encapsulation material 31 and opaque coating material 24 are mutually overlapping. Thus, in a laterally defined region, both, opaque encapsulation material 31 and opaque coating material 24 are present.

Said region can, e.g., describe a closed shape, e.g., a ring (wherein a ring does not need to be circular, but can describe, e.g., a rectangular line).

Walls of opaque wall structure 54 can exhibit, in a vertical cross-section, an L-shape, e.g., like illustrated in FIG. 12E.

Of course, an optical device 60 like the one of FIG. 12E can also be manufactured to include a passive optical component, such as, e.g., in FIG. 12C or 12D.

Such an optical device 60 is illustrated in FIG. 12F, including passive optical component 9, wherein in addition, a spectral filter layer 52 is included in the optical device 60. Spectral filter layer 52 covers at least a region laterally defined by the aperture 25. As illustrated in FIG. 12F, it can fully cover an upper side of the optical device 60. Said upper side can be opposite the substrate part 49a.

FIG. 12G depicts in a cross-sectional view a dual-channel optical device 60 which includes one passive optical component 9 per channel and has in both channels a step structure of the clear encapsulation. The optical device 60 of FIG. 12G can be understood as a dual-channel version of the single-channel optical device of FIG. 12F, only that the optional spectral filter layer 52 is omitted in FIG. 12G.

While in the single-channel optical devices depicted before, all walls of opaque wall structure 54 (made of opaque encapsulation material 31) can form opaque side walls which can be outer walls of the respective optical device, in dual-channel (or even more-channel) optical devices 60, like in the one illustrated in FIG. 12G, opaque wall structure 54 can include (opaque) walls 54' in addition to (opaque) walls 54". Therein, the walls 54' are inner walls of the optical device which optically separate the channels, while the walls 54" are outer walls of the optical device.

Opaque walls 54' can exhibit, in a vertical cross-section, a T-shape, e.g., like illustrated in FIG. 12G. The T-shape is still (substantially) a T-shape, also in case a split or a cut 48 is present in the wall.

Of course, also dual-channel (or even more-channel) optical devices 60, can include a substrate part 49a having, where it abuts one of the (opaque) walls (54 or 54'), a thickness which is reduced with respect to its thickness laterally between walls 54 and/or 54', similarly as illustrated in FIGS. 12A and 12B.

Optical devices with walls 54' can include cuts 48 (cf. FIG. 12G and also FIG. 9). Such cuts 48 can extend into (but not through) opaque walls 54'. The cuts 48 can be located at a top end of a wall 54', the top end facing away from the substrate member 61.

In FIG. 12G, a coordinate system indicating lateral directions x, y and vertical direction z is sketched which is applicable also to the other cross-sectional views.

As described, a manufactured optical device can include on an upper face of the clear encapsulation material 8 (which can be opposite the substrate part 49a) an opaque coating 23 which is photostructurable and particularly thin, while it can include outer walls (opaque wall structure 54) made of an opaque encapsulation material 31 which can have a thickness which is at least 5 times, e.g., at least 10 times, in instances even at least 20 times as large as the thickness of the opaque coating 23. The opaque encapsulation material 31 can be, e.g., not photostructurable.

The opaque encapsulation material 31 can be provided for improving a mechanical stability of the optical device, while the opaque coating 23 can be provided for defining the aperture 25.

An optical device can include
- a substrate member;
- one or more active optical components operable to emit or sense light of a particular range of wavelengths;
- a clear encapsulation material translucent to light of the particular range of wavelengths;
- an opaque coating material opaque for light of the particular range of wavelengths, defining at least one aperture associated with the one or more active optical components;
- an opaque wall structure made of an opaque encapsulation material opaque to light of the particular range of wavelengths.

The one or more active optical components 2 can be attached to the substrate member 61. In some embodiments, it can be placed onto substrate member 61, cf., e.g., FIGS. 12A-12C, 12E-12G and, correspondingly FIGS. 1A, 1C. In other embodiments, it can be integrated in and/or laterally surrounded by substrate member 61, cf., e.g., FIG. 12D and, correspondingly FIGS. 1B, 1D.

The clear encapsulation material can establish an overmold for the one or more active optical components 2. Cf., e.g., FIGS. 12A-12G.

The clear encapsulation material can establish an overmold for at least a portion of the substrate member. Cf., e.g., FIGS. 12A-12G.

The opaque coating material 31 can be present on a surface of the clear encapsulation material 5, wherein said surface can be opposing another surface of the clear encapsulation material 5 facing the substrate member 61. Cf., e.g., FIGS. 12A-12G.

The opaque wall structure 54 can be a single-piece molding part. Cf., e.g., FIGS. 12A-12G.

The opaque wall structure 54 can interface the substrate member 61, the clear encapsulation material 8 and the opaque coating material 24. Cf., e.g., FIGS. 12A-12G. If present, it can interface the resilient encapsulation material 7, too, cf. FIG. 12B.

A maximum distance of opaque encapsulation material of the opaque wall structure from a plane defined by the substrate member 61 can be equal to a maximum distance of opaque coating material from said plane, cf., e.g., FIGS. 12A-12G. An exemplary plane is illustrated in FIG. 12G by a dotted line, and said distance is illustrated by the dotted double-ended arrow. The plane is a vertical plane. And the plane can run through the substrate member 61.

This can be in contrast to constructing optical devices with separate aperture wafers and spacer wafers between aperture wafer and substrate wafer known from prior art; in such cases, walls can be established by the parts of the spacer wafer, and apertures can be established by parts of the aperture wafer, and the maximum distance of the aperture-bearing part (part of aperture wafer) to said plane is larger than the maximum distance of the side-wall-establishing part (part of spacer wafer) to said plane. It is typically larger by the thickness of the aperture wafer.

Furthermore, a vertical extension of the opaque coating material can overlap with a vertical extension of the opaque encapsulation material of the opaque wall structure. E.g., a vertical extension of the opaque coating material can be included in a vertical extension of the opaque encapsulation material of the opaque wall structure. And, a vertical extension of the opaque coating material can terminate together with a vertical extension of the opaque encapsulation material of the opaque wall structure. Examples for all this are shown, e.g., in FIGS. 12A-12G.

The optical device 60 can be devoid any hollow inclusions. Cf., e.g., FIGS. 12A-12G. The term hollow inclusion is meant to say that the inclusion contains a vacuum or a gas or a liquid and is completely surrounded by solid material. This can contribute to an enhanced manufacturability and to an improved stability and durability of the optical device 60.

So far, with reference to the Figures, methods and devices have been described under the assumption that the spectral filter layer material is applied after singulation. In the following, the "other variant" of the invention already introduced before will be described with reference to further Figures. In this "other variant", no opaque encapsulation material is applied (cf. item 24 in FIGS. 6A-6D), but a spectral filter layer material is applied onto the clear encapsulation and structured to produce a spectral filter layer. Accordingly, features related to the opaque coating need not be provided in the "other variant". Otherwise, the methods and optical devices according to the "other variant" can have the same features as described elsewherein herein.

FIG. 14 shows, in a cross-sectional view, a clear encapsulation wafer on which spectral filter layer material 52' is applied. The clear encapsulation material 8 can be unstructured, having a planar surface (as illustrated in FIG. 14) on which the spectral filter layer material 52' is applied. Alternatively, the clear encapsulation material 8 can be structured, e.g., like in FIG. 4 or in FIG. 5A or in FIG. 5C. However, depressions/protrusions 17, steps 18 or grooves 19 (cf. FIGS. 5A, 5C) can be dispensed with because their function of avoiding delamination of opaque coating material 24 (cf. FIG. 6A) is superfluous since no opaque coating material is applied in the "other variant". But passive optical components (such as passive optical components 9 in FIG. 3) can be provided, and will merely not be illustrated in the following Figures.

Application of spectral filter layer material 52' can be accomplished, e.g., by spray coating, or by spinning, or in other ways.

A spectral filter layer is then produced by structuring the applied spectral filter layer material 52', which can be accomplished using a photolithographic technique. This can make possible to achieve a high precision of shape and position of structures, such as of apertures.

E.g., the spectral filter layer material 52' can be selectively illuminated, e.g., using a mask or maskless, e.g., using direct laser writing, and then, the illuminated (or the not-illuminated) spectral filter layer material is removed, e.g., wet-chemically.

FIG. 15 shows, in a cross-sectional view, a clear encapsulation wafer on which such a spectral filter layer is present. E.g., the spectral filter layer can include a multitude of patches of spectral filter layer material 52'. E.g., each of the patches can be associated with one or more of the active optical components 2.

Spectral filter layer 52' can let pass light in one or more specific wavelength ranges while blocking, e.g., absorbing, light in other wavelength ranges. E.g., it can be provided that spectral filter layer 52' is translucent for light of a particular range of wavelengths emitted by or detectable by the active optical components 2.

For example, spectral filter layer 52' can be an IR filter, and passive optical components 2 are operable to emit IR light and/or are operable to detect IR light.

When the spectral filter material is present in all the apertures 25, light emitted by and detected by the active optical components 2, respectively, can be filtered by the spectral filter layer when passing through the respective aperture 25.

A thickness of spectral filter layer 52 can be, e.g., between 0.5 µm and 50 µm, such as between 1 µm and 20 µm, e.g., between 1 µm and 10 µm.

Analogously to what is described above in conjunction with FIG. 7, in a subsequent step, a trenched wafer 1f' is produced like the one depicted in a cross-sectional view in FIG. 16. Trenched wafer 1f' is produced by creating trenches 27, e.g., in the wafer of FIG. 15 which extend fully through the clear encapsulation. The trenches 27 can, as illustrated in FIG. 16, extend partially into substrate 3 (for better light tightness of the produced optical devices).

The trenches 27 do not pass through the spectral filter layer material 52'. Accordingly, special precautious measures against delamination of the spectral filter layer material 52', like those taken for prevention of delamination of the opaque encapsulation, can be dispensed with in case of the presently described "other variant".

Producing the trenches 27 (and side walls 30) can more specifically also be understood as producing a wafer-level arrangement 29 of intermediate products 28.

Analogously to what is described above in conjunction with FIG. 8, in a subsequent step, opaque encapsulation material 31 is applied.

FIG. 17 depicts in a cross-sectional view a detail of an opaque encapsulation wafer 1g' which can be obtained by applying to a trenched wafer 1f', such as to trenched wafer 1f' of FIG. 16, the opaque encapsulation material 31. The trenches 27 created before (cf. FIG. 16) can be filled by the application of the opaque encapsulation material 31.

FIG. 17 illustrates that opaque encapsulation material 31 can be applied to the wafer-level arrangement 29 of intermediate products 28 depicted in FIG. 16.

In FIG. 17, opaque encapsulation wafer 1g' is depicted along with a replication tool 33 operable to shape opaque encapsulation material 31.

Like explained above for the shaping by replication of the clear encapsulation, also the opaque encapsulation can be shaped by means of a replication tool 33 including one or more side parts having a chamfered side shaping surface (cf. item 1c in FIG. 4A). Likewise, this can provide an improved anchoring of the opaque encapsulation to the clear encapsulation. This can reduce the exposure of the wafer to mechanical stress.

Replication tool 33 can, as an option, include at least one resilient inner wall, such as resilient inner wall 34 in FIG. 8. In that case, replication tool 33 can also be referred to as a resilient replication tool 33. In addition, replication tool 33 can include a rigid back as a mechanical support for resilient inner wall 34, such as rigid back 37 in FIG. 8.

During shaping the opaque encapsulation material 31, a portion 47a of a surface of the replication tool can be contact with the spectral filter layer material 52' in order to prevent opaque encapsulation material from being deposited thereon. More concretely, the spectral filter layer has top surfaces (in particular: each patch of spectral filter layer material 52' can have one such top surface) facing away from the clear encapsulation material 8. Surface portions 47a of the replication tool 33 are, e.g., prior to applying the opaque encapsulation material 31, brought into contact with the top surfaces so as to seal the top surfaces. The opaque encapsulation material 8 will then, e.g., by vacuum injection molding, be applied to surround the spectral filter layer (and, e.g., each patch of the spectral filter layer material 52') and be in sideways contact therewith, and despite of that, the top surfaces of the spectral filter layer remain uncovered by the opaque encapsulation material 8, like illustrated in FIG. 17.

This way, apertures defined by the spectral filter layer are provided with (perfectly) mating aperture stops established by the opaque encapsulation, and the apertures themselves remain free from the spectral filter layer material 52'. Accordingly, the apertures remain defined (with high precision) by the spectral filter layer. And high-precision aperture stops are readily produced.

Replication tool 33 together with the spectral filter layer shape the opaque encapsulation material 52'.

Replication tool 33 can be unstructured, i.e. flat. This way, lateral alignment requirements of the replication too 33 with respect to the spectral filter layer are very low.

Alternatively, it can be provided that replication tool 33 is structured, e.g., so as to include a multitude of protrusions, wherein the protrusions (which can, e.g., include the surface portions 47a) can be planar, e.g., like illustrated in FIG. 17. A lateral extension of each of the protrusions can exceed a lateral extension of associated portions of the spectral filter layer, in all lateral directions. This way, relatively relaxed lateral alignment requirements for the replication tool 33 with respect to the spectral filter layer are achievable.

As symbolized in FIG. 17 by the open arrow, replication tool 33 (or more specifically in some embodiments: of a resilient inner wall of replication tool) is pressed against trenched wafer 1f during application of the opaque encapsulation material 31, and more specifically, surface portion(s) 42a is/are in full direct contact with top surfaces of the spectral filter layer.

The pressure applied can be due to an underpressure applied for the VIM process. Alternatively or in addition, further pressure can be applied (externally). This way, surface portion(s) 42a and the top surfaces can, together, form a seal, wherein the seal cannot be crossed by opaque encapsulation material 31 during its application to trenched wafer 1f'.

By the protrusions of the replication tool 33, baffles can be produced (established by the opaque encapsulation material 31. Such baffles can contribute to defining a field of view and field of illumination, respectively, for the active optical components 2 via the respective apertures. In addition, such baffles can contribute to protecting the apertures (and the spectral filter layer, respectively) from mechanical damage, simply because the baffles extend vertically beyond the spectral filter layer.

Furthermore, in FIG. 17, cuts 48 are illustrated in dotted lines. Those optional cuts 48, ways to produce them and their effects have already been described further above.

The arrows in the lower portion of FIG. 17 show where a subsequent singulation can take place. For example, if separation is accomplished at positions indicated by arrows with unbroken lines (and not at positions indicated by arrows with dashed lines), multi-channel, e.g., dual-channel optical devices can be produced; and if separation is accomplished at positions indicated by any of the arrows (with unbroken or with dashed lines), single-channel optical devices can be obtained.

FIG. 18 shows, in a cross-sectional view, a dual-channel optical device 60 including no passive optical components. Of course, one or more passive optical components, such as passive optical components 9 in FIG. 12G, could be provided. Furthermore, the optical device 60 includes no baffles. E.g., the opaque encapsulation can have been shaped using an unstructured replication tool, in contrast to the structured replication tool 33 of FIG. 17 which would have resulted in optional baffles.

Optical device 60 can be, e.g., a proximity sensor.

Optical device 60 exhibits a wall structure of opaque encapsulation material 31 including L-shaped walls 54" and a T-shaped wall 54'. T-shaped wall 54' is split by having a cut 48 in its middle top (where the two bars of the "T" meet).

Furthermore, a thickness of the substrate member 61 in a first region in which the opaque wall structure abuts the substrate member 61 is smaller than a thickness of the substrate member 61 in a second region encircled by the first region. One or more active optical components 2 are attached in the second region to the substrate member 61.

Spectral filter layer material 52' defines apertures and is laterally surrounded by opaque encapsulation material 31 adjoining it (sideways).

FIG. 19 shows a flow chart of an example of a method for manufacturing optical devices on wafer-level according to the "other variant" of the invention. FIG. 19 is identical to FIG. 11 except that steps 120 and 130 are replaced by steps 122 and 132. In step 122, the spectral filter layer material is applied (cf. also FIG. 14). In step 132, the spectral filter layer material is structured (cf. also FIG. 15).

The invention claimed is:

1. An optical device comprising:
a substrate member;
one or more active optical components operable to emit or sense light of a particular range of wavelengths;
a clear encapsulation material translucent to light of the particular range of wavelengths, wherein the clear encapsulation material establishes an overmold for the one or more active optical components;

a spectral filter layer material structured on a face of the clear encapsulation material so as to define one or more apertures over and associated with the one or more active optical components each;

an opaque encapsulation material opaque to light of the particular range of wavelengths establishing an opaque wall structure;

an opaque coating opaque to light of the particular range of wavelengths and which abuts the opaque encapsulation material, wherein the opaque coating establishes one or more aperture stops, wherein the one or more aperture stops delimit the one or more apertures defined by the spectral filter layer material;

wherein the one or more active optical components are attached to the substrate member;

wherein the clear encapsulation material is laterally surrounded by the opaque wall structure, wherein the opaque coating is disposed above the clear encapsulation material;

wherein each aperture is between walls defined by the opaque wall structure smaller than a spacing between the walls; and wherein the substrate member is disposed below the clear encapsulation material.

2. The optical device according to claim 1, wherein the spectral filter layer material is translucent for light of the particular range of wavelengths.

3. The optical device according to claim 1, wherein the spectral filter layer material is opaque for light of a range of wavelengths outside the particular range of wavelengths.

4. The optical device according to claim 1, wherein the opaque wall structure comprises at least one wall having a top end facing away from the substrate member, wherein at least one of the opaque encapsulation material of the wall at the top end is split;

a cut is present in the top end of the wall.

5. The optical device according to claim 1, comprising one or more passive optical components made of the clear encapsulation material.

6. The optical device according to claim 1, wherein a thickness of the substrate member in a first region in which the opaque wall structure abuts the substrate member is smaller than a thickness of the substrate member in a second region encircled by the first region.

7. The optical device according to claim 1, comprising a resilient encapsulation material establishing an overmold for the one or more active optical components, wherein the clear encapsulation material establishes an overmold for the resilient encapsulation material.

8. The optical device according to claim 1, wherein the opaque wall structure comprises at least one wall exhibiting an L-shape in a cross-section.

9. The optical device according to claim 1, wherein the opaque wall structure comprises at least one wall exhibiting substantially a T-shape in a cross-section.

10. The optical device according to claim 1, wherein the substrate member is opaque to light of the particular range of wavelengths, and wherein the optical device comprises an enclosure which is light-tight for light of the particular range of wavelengths with the exception of the one or more apertures, the enclosure comprising at least a portion of the substrate member and at least a portion of the opaque encapsulation material, and wherein the one or more active optical components are located inside the enclosure.

11. The optical device according to claim 1, wherein the optical device is a proximity sensor.

* * * * *